(12) United States Patent  
Eisenstadt et al.

(10) Patent No.: US 8,966,425 B1  
(45) Date of Patent: Feb. 24, 2015

(54) CLOCK TREE GENERATION AND ROUTING

(71) Applicant: Pulsic Limited, Bristol (GB)

(72) Inventors: Robert Eisenstadt, Los Altos, CA (US); Mark Waller, Bristol (GB); Tim Parker, Bristol (GB); Mark Williams, Glos (GB); Jeremy Birch, Bristol (GB); Graham Balsdon, Glos (GB); Fumiako Sato, Tokyo (JP)

(73) Assignee: Pulsic Limited (GB)

( * ) Notice: Subject to any disclaimer, the term of this patent is extended or adjusted under 35 U.S.C. 154(b) by 0 days.

(21) Appl. No.: 13/829,512

(22) Filed: Mar. 14, 2013

Related U.S. Application Data

(60) Provisional application No. 61/654,927, filed on Jun. 3, 2012.

(51) Int. Cl.
*G06F 17/50* (2006.01)

(52) U.S. Cl.
CPC .................................. *G06F 17/5031* (2013.01)
USPC ........................................... 716/120; 716/126

(58) Field of Classification Search
CPC combination set(s) only.
See application file for complete search history.

(56) References Cited

U.S. PATENT DOCUMENTS

| | | | |
|---|---|---|---|
| 6,651,232 B1 * | 11/2003 | Pileggi et al. | 716/114 |
| 6,698,006 B1 * | 2/2004 | Srinivasan et al. | 716/114 |
| 6,751,786 B2 * | 6/2004 | Teng et al. | 716/114 |
| 6,865,726 B1 * | 3/2005 | Igusa et al. | 716/105 |
| 7,017,132 B2 * | 3/2006 | Hou et al. | 716/104 |
| 7,051,310 B2 * | 5/2006 | Tsao et al. | 716/114 |
| 7,546,567 B2 * | 6/2009 | Cheon et al. | 716/113 |
| 7,653,884 B2 * | 1/2010 | Furnish et al. | 716/103 |
| 7,937,677 B2 * | 5/2011 | Chien et al. | 716/103 |
| 8,214,790 B2 * | 7/2012 | Masleid et al. | 716/139 |
| 8,479,141 B1 * | 7/2013 | Waller et al. | 716/126 |
| 8,631,378 B2 * | 1/2014 | Lasher et al. | 716/130 |
| 2010/0229142 A1 * | 9/2010 | Masleid et al. | 716/10 |
| 2012/0299627 A1 * | 11/2012 | Taskin et al. | 327/141 |
| 2013/0047127 A1 * | 2/2013 | Arunachalam | 716/103 |

* cited by examiner

*Primary Examiner* — Leigh Garbowski
(74) *Attorney, Agent, or Firm* — Aka Chan LLP

(57) ABSTRACT

A technique generates small scale clock trees using a spine-based architecture (using spine routing) while also using clustered placement. Techniques are used to control clock sink cluster contents in order to minimize clock skew, minimize clock buffer count, and minimize use of routing resources. This approach also provides the user with ample structure and control to customize small efficient clock trees, and can also reduce clock power consumption.

20 Claims, 19 Drawing Sheets

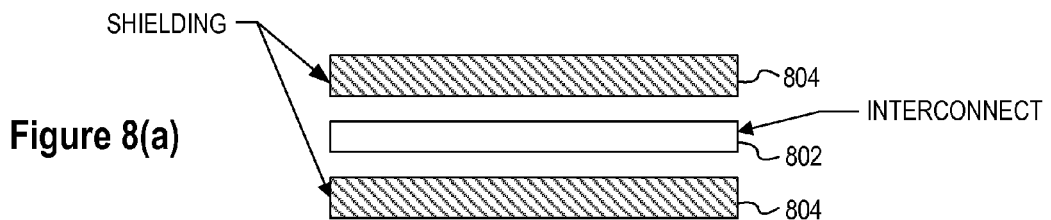
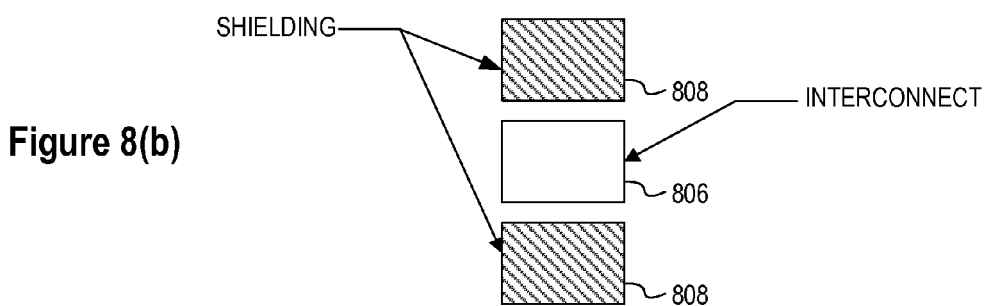
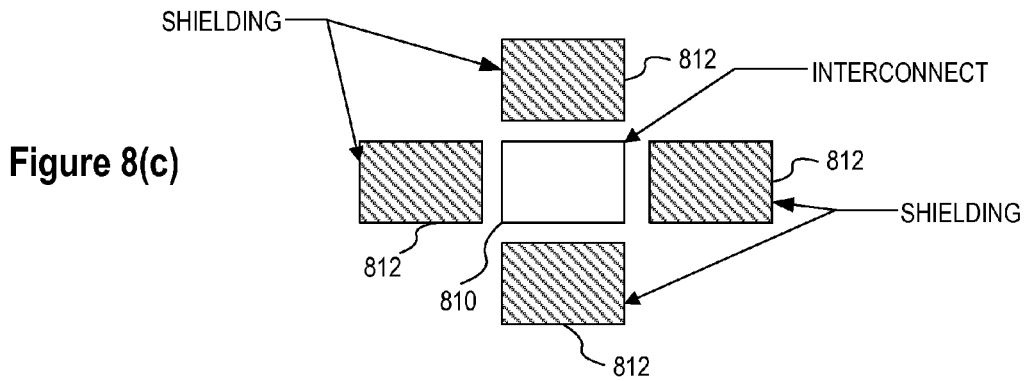
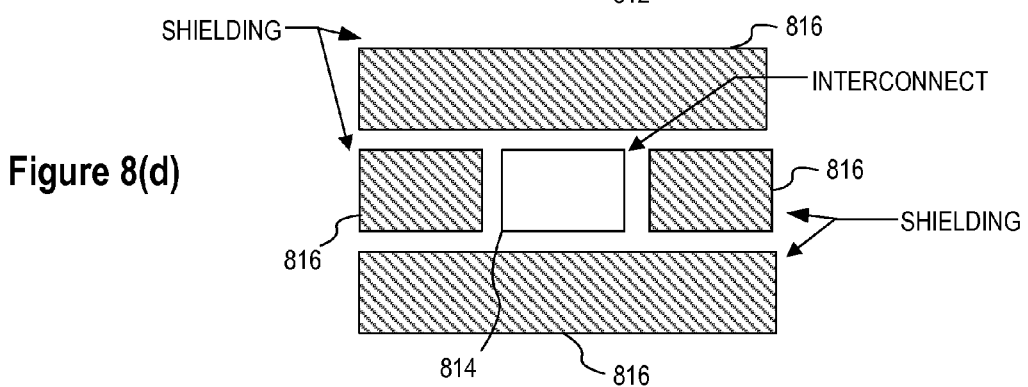

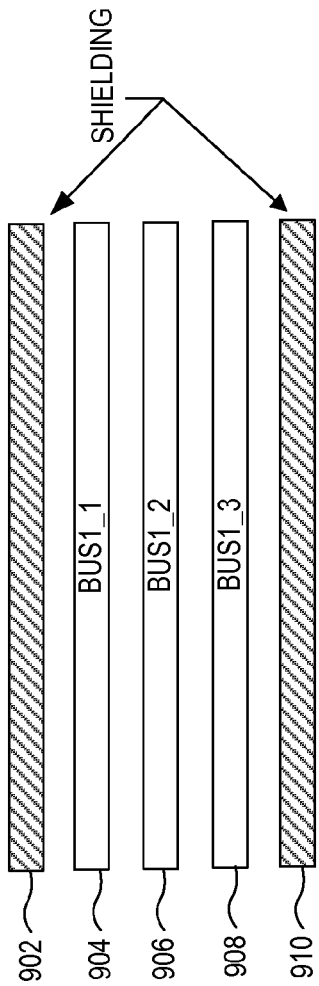
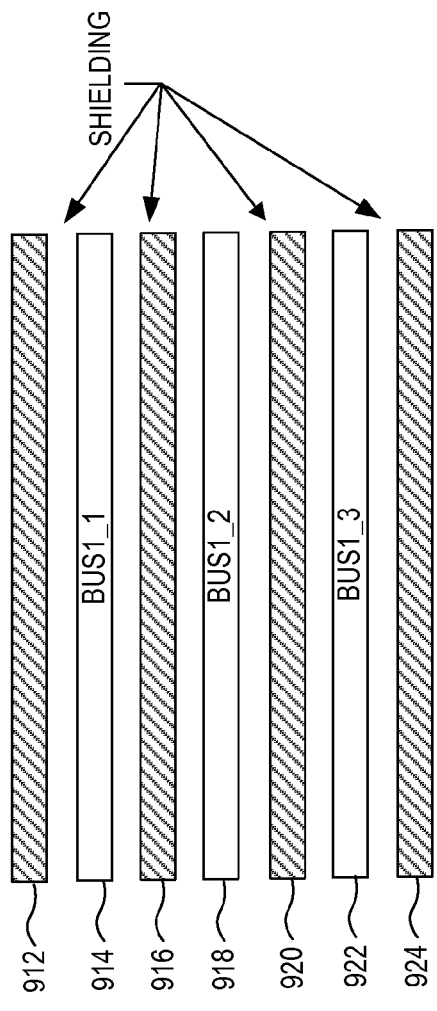
Figure 9(a)
Figure 9(b)

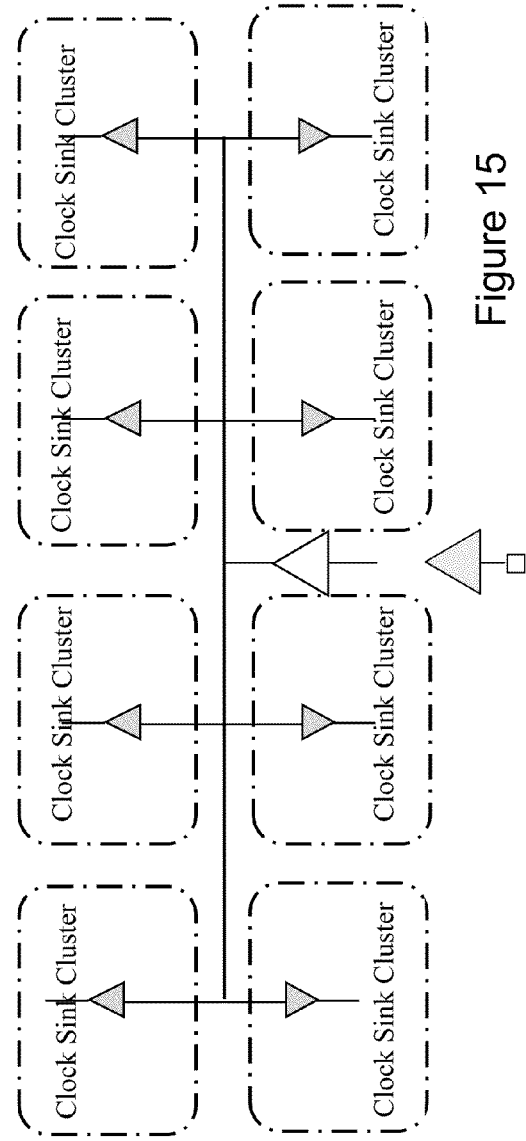
Figure 15
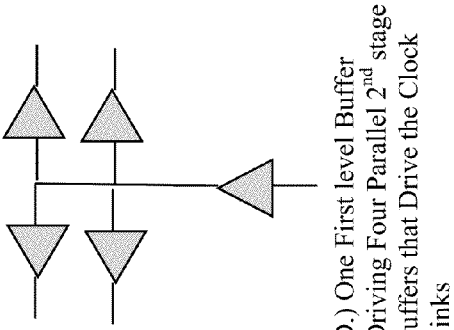
D.) One First level Buffer Driving Four Parallel 2$^{nd}$ stage buffers that Drive the Clock Sinks
Figure 16D
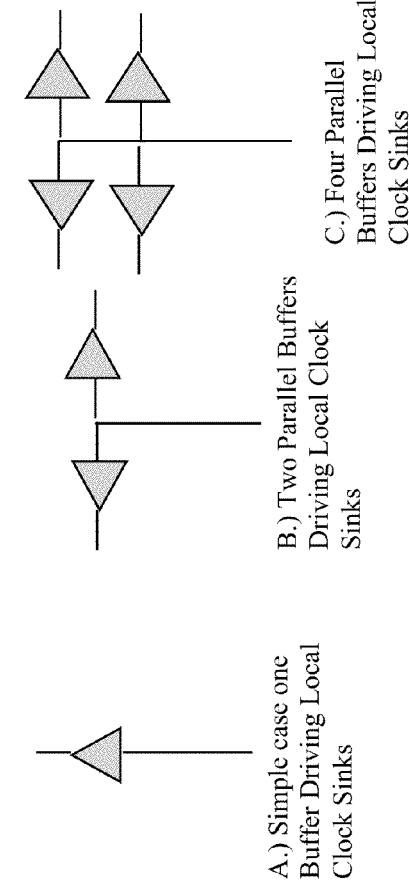
C.) Four Parallel Buffers Driving Local Clock Sinks
Figure 16C
B.) Two Parallel Buffers Driving Local Clock Sinks
Figure 16B
A.) Simple case one Buffer Driving Local Clock Sinks
Figure 16A

Figure 19D

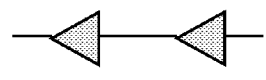

One 1st level BufX16 (for delay matching)
One $2^{nd}$ level BufX16 that drives the local

Figure 19E

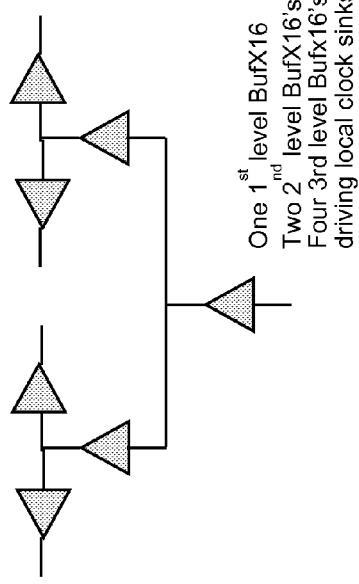

One $1^{st}$ level BufX16
Two $2^{nd}$ level BufX16's
Four 3rd level Bufx16's driving local clock sinks

Figure 19F

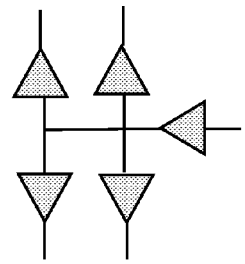

Ex: One first level BufX16 drives four parallel $2^{nd}$ level BufX16's that drive local clock sinks Figure 19A. Cluster Buffer Table Example A.

| Tree Level | #Buffers | Cell |
|---|---|---|
| 1 | 1 | BufX16 |
| 1 | 1 | BufX16 |

Figure 19B. Cluster Buffer Table Example B.

| Tree Level | #Buffers | Cell |
|---|---|---|
| 1 | 1 | BufX16 |
| 2 | 2 | BufX16 |
| 3 | 4 | BufX16 |

Figure 19C. Cluster Buffer Table Example C

| Tree Level | #Buffers | Cell |
|---|---|---|
| 1 | 1 | BufX16 |
| 2 | 4 | BufX16 |

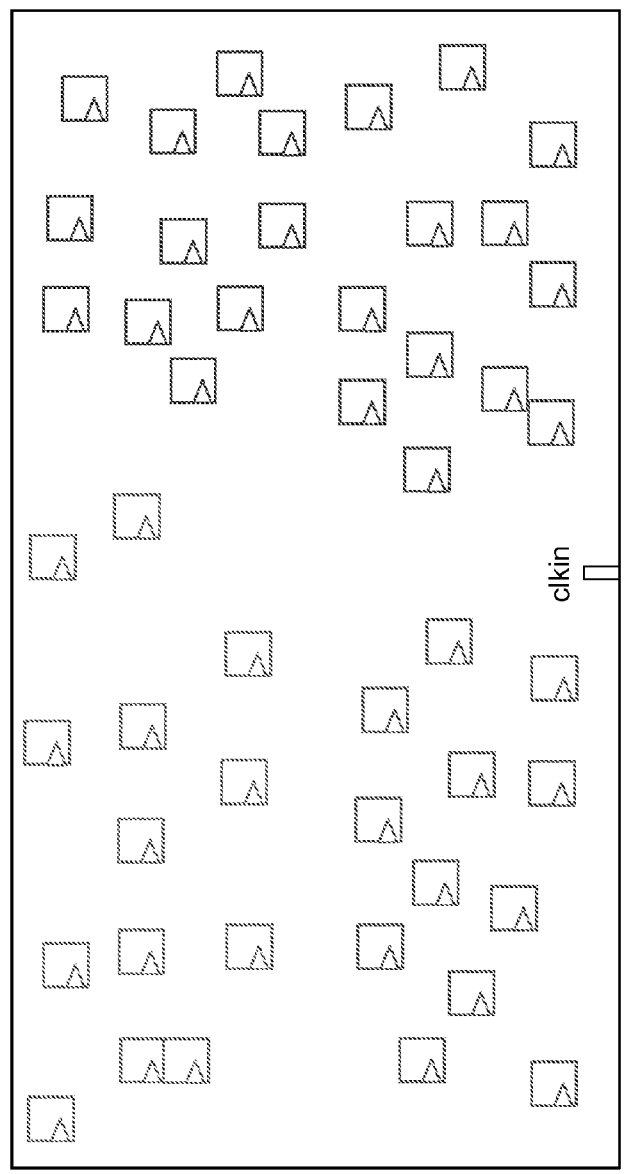

Leaf cell placement unaligned in Y

Leaf cell placement aligned in Y to optimize clock stitch routing

Add extra routing to balance close sink clusters

CLOCK TREE GENERATION AND ROUTING

CROSS-REFERENCE TO RELATED APPLICATIONS

This patent application claims the benefit of U.S. patent application 61/654,927, filed Jun. 3, 2012, which is incorporated herein by reference along with all other references cited in this application.

BACKGROUND OF THE INVENTION

The present invention relates to the field of electronic design automation (EDA) or computer aided design (CAD) software and, more particularly, to techniques for placing devices and routing interconnects, especially clock signal lines, in integrated circuits.

Integrated circuit technology is a marvel of the modem age. Integrated circuits are also sometimes referred to as "chips." Integrated circuits are used in many applications such as computers, consumer electronics, networking, and telecommunications. There are many types of integrated circuits including microprocessors, microcontrollers, application specific integrated circuits (ASICs), gate arrays, programmable logic devices (PLDs), field programmable gate arrays (FPGAs), dynamic random access memories (DRAMs), static random access memories (SRAMs), erasable programmable read only memories (EPROMs), electrically erasable programmable read only memories (EEPROMs), and Flash memories. Integrated circuits may also include combinations of one or more of these specific types of integrated circuit. For example, an ASIC may include a portion of an embedded DRAM.

Integrated circuit technology continues to rapidly advance. Modern integrated circuits may contain hundreds, thousands, or even millions of individual devices (e.g., transistors, resistors, diodes, capacitors, and others) or cells. Such designs are much too large for an integrated circuit designer to manage effectively manually. For example, an integrated circuit design may have hundreds or thousands of inputs and outputs that need to be routed. To route interconnect manually between the inputs and outputs, it would take an integrated circuit designer an inordinate amount of time.

Therefore, automation tools are needed to make easier and expedite the task of designing an integrated circuit. It is important to be able to produce a circuit design and layout meeting or exceeding the design objectives before the integrated circuit is fabricated. This will help avoid a costly redesign to correct errors or improve performance to meet specifications. Techniques are needed to provide high-performance circuit designs and circuit layouts.

Speed in the design process is also an important consideration for an EDA system. Time-to-market pressures demand design tools provide rapid, accurate results, especially for large complex designs. By obtaining results more quickly, designers can make more meaningful decisions on design tradeoffs by not having to wait for days to even weeks to obtain accurate results.

As a component of an EDA system, automatic interconnect routers, or routers, have been developed to automate the placement of interconnects in integrated circuit devices. Routers generate the geometry of the interconnects to connect pins or a network of pins together. Traditional routers typically include a coarse routing process and a fine routing process. The coarse router provides a general path for interconnect routing. The fine router provides the actual interconnect segments and their geometries. The fine router creates interconnect routes that are "clean." Clean refers to making routes that do not have design rule violations (such as meeting timing, crosstalk, and antenna effect specifications) and do not overlap other structures (such as other interconnect routes and obstacles).

It is desirable to provide better or improved routing quality when using an automatic router. Better routing quality refers to an improved routing pattern or design in order to enhance signal propagation characteristics, such as reducing noise, reducing signal propagation time, and other signal characteristics. In particular, traditional routers do not necessarily generate optimal linear interconnects. For example, a traditional router often produces interconnect with many jogs and bends, which do not facilitate a fast signal path. Linear interconnects are desirable so as to improve integrated circuit performance, reduce resistance and capacitance of interconnects, reduce die size, and improve circuit layout organization.

As a result of the shortcomings of traditional automatic routers, integrated circuit designers manually reroute interconnects to increase linear interconnects. However, manual rerouting is time consuming, especially for large designs, may introduce design rule violations, and the results of manual rerouting may not be optimal.

As can be seen, techniques are needed to route interconnects, especially clock signal lines, of integrated circuits in an optimal way for improving designs, especially improving the routing quality and speed of automated routing.

BRIEF SUMMARY OF THE INVENTION

A technique generates small scale clock trees using a spine-based architecture (using spine routing) while also using clustered placement. Techniques are used to control clock sink cluster contents in order to minimize clock skew, minimize clock buffer count, and minimize use of routing resources. This approach also provides the user with ample structure and control to customize small efficient clock trees, and can also reduce clock power consumption.

In various implementations, a techniques includes: (1) Using netlist aware placement of clock sinks to drive clock sink clustering and buffering. (2) Providing a user interface to view and update the sink cluster contents. (3) Providing a user interface to select the clock buffering approach (number of buffers/cluster and levels/cluster), and the clock buffer cell or cells. (4) Using spine and stitch routing to balance the delays to the clock buffers that drive the sink clusters.

A technique routes interconnects of integrated circuits, and is broadly applicable to many types of integrated circuit including custom, semicustom, and high-performance integrated circuits. In an embodiment, the technique of the present invention is embodied in a computer software program that is to be executed by a computer system. In particular, the technique facilitates improved routing quality of interconnects and has fast execution times. The technique is applicable to small circuits having relatively few components and is especially suited for integrated circuits having hundreds, thousands, or millions of components.

A spine router is a specialized application for routing connectivity in long, relatively thin areas or routing areas with high aspect ratios, such as a ratio or 4:1 or greater. These long, relatively thin areas are sometimes referred to in this application as a spine, channel, pipeline, or canal. An example of a routing area with a high aspect ratio is an area found between peripheral logic devices of memory array blocks in memory devices or devices with embedded memory. Another example of a routing area with a high aspect ratio is an area found in datapath design, such as in an arithmetic logic unit (ALU) or floating point processing unit (FPU) or a processor or embedded processor. Datapath designs will have these high aspect area routing areas as the number of width of the processor increase, such as 64-bit processors, 128-bit processors, and so forth.

Long, relatively thin routing areas typically contain connections between pins (sometimes referred to as connectors or subpins) separated by large distances in one direction and small distance in the other. The technique lays down a single spine interconnect per net that extends in the long direction between the two outermost pins on the net. A net is a set of coupled pins. Then the pins are "stitched" onto the spine interconnect. The pins are connected by a straight interconnect to the spine interconnect if possible. Otherwise, they are connected by an interconnect with a minimum cost-based deviation from a straight interconnect. The placement of the spines are made so as to minimize the overall connection distance and corresponding signal delay. Although a spine router is well suited for routing in a spine, it can be used to route interconnects anywhere in a design, including areas outside the spine.

In an embodiment of the invention, a method for routing at least one interconnect of an integrated circuit is provided. At least two pins to couple are identified. A route area is calculated. The route area extends a distance in a first direction to comprise positions in the first direction of the at least two pins. A spine interconnect is routed to extend in the first direction an entire length of the route area in the first direction. A plurality of stitching interconnects are routed in a second direction to couple each of the at least two pins to the spine interconnect. The second direction is orthogonal to the first direction. In this embodiment, the method may further include determining if at least one forbidden area is located within the route area. The at least one forbidden area extends in the first direction the entire length of the route area in the first direction and includes at least one obstacle (i.e., an area on specific layers that presents a restriction to routing or placement). Routing the spine interconnect avoids the at least one forbidden area.

In another embodiment, stitching interconnects may be automatically rerouted in the first direction and second direction to avoid obstacles. Alternatively, one or more edges of the routing area may coincide with one or more edges of chips or circuit elements.

In an embodiment of the invention, the spine interconnect may be position in the second direction to reduce an average length of the stitching interconnects. For example, the position of the spine interconnect in the second direction can be the weighted average position in the second direction of the connected pins in the route area or, alternatively, the closest position to the weighted average position outside of a forbidden area.

In an alternative embodiment, N pins are identified to couple. A rectangular route area that includes the positions in a first direction of the N pins is calculated. A determination is made as to whether at least one forbidden area is located within the route area. A spine interconnect is routed extending in the first direction an entire length of the route area in the first direction. Routing of the spine interconnects is outside of the at least one forbidden area. N stitching interconnects are routed in a second direction to couple each of the N pins to the spine interconnect. The at least one forbidden area is as a rectangular area that includes at least one obstacle and extends in the first direction an entire length of the route area in the first direction. The first direction is orthogonal to the second direction.

The spine interconnect may be positioned in the second direction to reduce an average length of the N stitching interconnects. For example, the position of the spine interconnect in the second direction can be the quotient of (i) the sum of the positions of the N pins in the second direction and (ii) N or, alternatively, the closest position to such quotient outside of any forbidden area.

In yet another embodiment of the present invention, a computer program product stored on a computer-readable storage medium for routing a plurality of nets of an integrated circuit is provided. The computer program product includes: code for identifying pins to couple for each net; code for calculating a route area for each net to comprise positions in a first direction of the pins for such net; code for determining for each route area if at least one forbidden area is located within the route area; code for routing outside of the at least one forbidden area a plurality of spine interconnects extending in a first direction the entire length of each corresponding route area in the first direction; and code for routing a plurality of stitching interconnects in a second direction to couple each of the pins to the corresponding spine interconnect. The at least one forbidden area being an area to include at least one obstacle and extending in the first direction an entire length of the corresponding route area in the first direction.

In another embodiment, a method of displaying a route area for spine routing is provide. A circuit layout having a spine area is displayed on a display device. A rectangular box is drawn to encompass at least a portion of the spine area, the portion includes at least two pins to couple. The circuit layout along with the rectangular box is displayed on the display device.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 8(a), 8(b), 8(c), and 8(d) show exemplary embodiments of automatic routing of shielding.

FIGS. 9(a) and 9(b) show exemplary embodiments of automatic routing of shielding for bus interconnects.

FIG. 15 shows a simplified example of sink clustering.

FIGS. 16A-16D show a simplified example of clock tree construction.

FIGS. 19A-19F show cluster buffer table examples.

FIGS. 20A-20B shows an example of sink cluster editor showing four local sink clusters within a block.

DETAILED DESCRIPTION OF THE INVENTION

Figure 1:
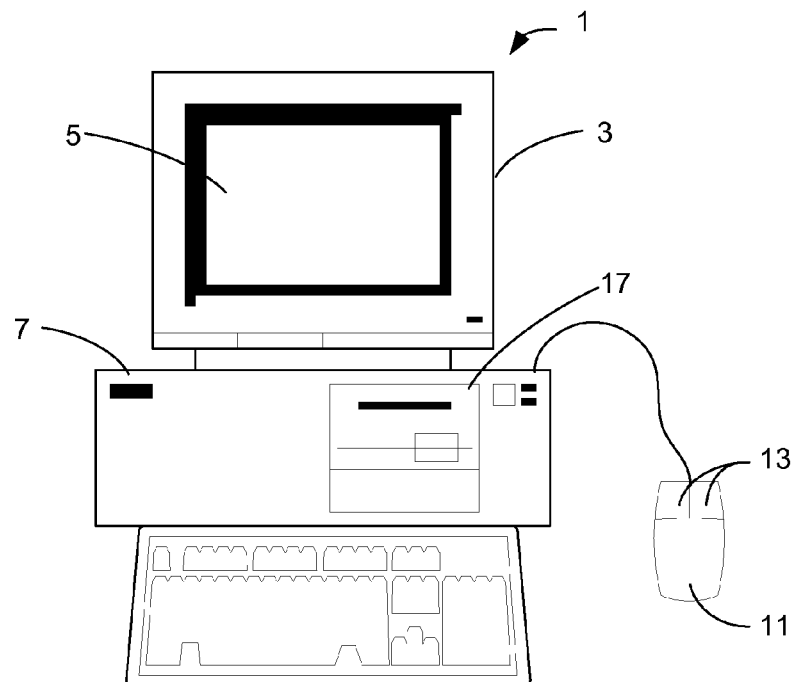
FIG. 1 shows a system of the present invention for performing electronic circuit design, including spine interconnect routing.

FIG. 1 shows an electronic design automation (EDA) system of the present invention for designing an electronic circuit or integrated circuit, including automatic shape-based routing of interconnect in spines for integrated circuit design. In an embodiment, the invention is software that executes on a computer workstation system, such as shown in FIG. 1. FIG. 1 shows a computer system 1 that includes a monitor 3, screen 5, cabinet 7, keyboard 9, and mouse 11. Mouse 11 may have one or more buttons such as mouse buttons 13. Cabinet 7 houses familiar computer components, some of which are not shown, such as a processor, memory, mass storage devices 17, and the like. Mass storage devices 17 may include mass disk drives, floppy disks, Iomega ZIP™ disks, magnetic disks, fixed disks, hard disks, CD-ROMs, recordable CDs, DVDs, recordable DVDs, flash and other nonvolatile solid-state storage, tape storage, reader, and other similar media, and combinations of these. A binary, machine-executable version, of the software of the present invention may be stored or reside on mass storage devices 17. Furthermore, the source code of the software of the present invention may also be stored or reside on mass storage devices 17 (e.g., magnetic disk, tape, CD-ROM, or DVD).

Figure 2:
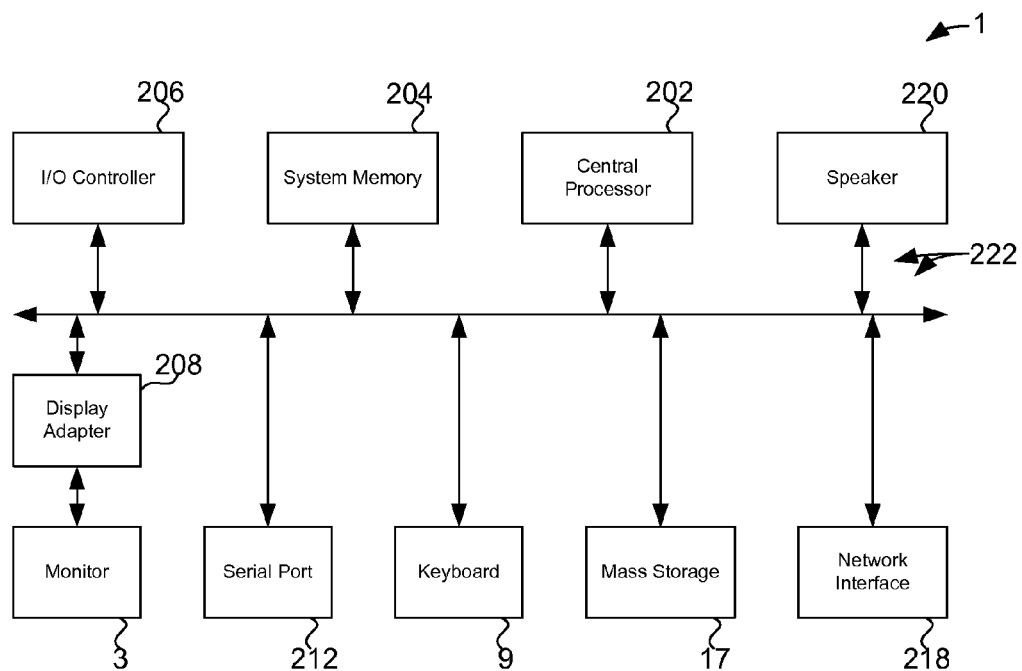
FIG. 2 shows a simplified system block diagram of computer system 1 used to execute the software of the present invention.

Further, FIG. 2 shows a system block diagram of computer system 1 used to execute software of the present invention. As in FIG. 1, computer system 1 includes monitor 3, keyboard 9, and mass storage devices 17. Computer system 1 further includes subsystems such as central processor 202, system memory 204, input/output (I/O) controller 206, display adapter 208, serial or universal serial bus (USB) port 212, network interface 218, and speaker 220. The invention may also be used with computer systems with additional or fewer subsystems. For example, a computer system could include more than one processor 202 (i.e., a multiprocessor system) or the system may include a cache memory.

Arrows such as 222 represent the system bus architecture of computer system 1. However, these arrows are illustrative of any interconnection scheme serving to link the subsystems. For example, speaker 220 could be connected to the other subsystems through a port or have an internal direct connection to central processor 202. Computer system 1 shown in FIG. 1 is but an example of a computer system suitable for use with the present invention. Other configurations of subsystems suitable for use with the present invention will be readily apparent to one of ordinary skill in the art.

Computer software products may be written in any of various suitable programming languages, such as C, C++, Pascal, Fortran, Perl, MatLab (from MathWorks), SAS, SPSS, and Java. The computer software product may be an independent application with data input and data display modules. Alternatively, the computer software products may be classes that may be instantiated as distributed objects. The computer software products may also be component software such as Java Beans (from Sun Microsystems) or Enterprise Java Beans (EJB from Sun Microsystems). An operating system for the system may be one of the Microsoft Windows® family of operating systems (e.g., Windows 95, 98, Me, Windows NT, Windows 2000, Windows XP), Linux, UNIX, or Sun OS. Other operating systems may be used.

Furthermore, the computer may be connected to a network and may interface to other computers using this network. For example, each computer in the network may perform part of the task of the many series of spine routing steps in parallel. Furthermore, the network may be an intranet, internet, or the Internet, among others. The network may be a wired network (e.g., using copper), telephone network, packet network, an optical network (e.g., using optical fiber), or a wireless network, or any combination thereof. For example, data and other information may be passed between the computer and components (or steps) of a system of the invention using a wireless network using a protocol such as Wi-Fi (IEEE standards 802.11, 802.11a, 802.11b, 802.11e, 802.11g, and 802.11i, just to name a few examples). For example, signals from a computer may be transferred, at least in part, wirelessly to components or other computers.

Figure 3:
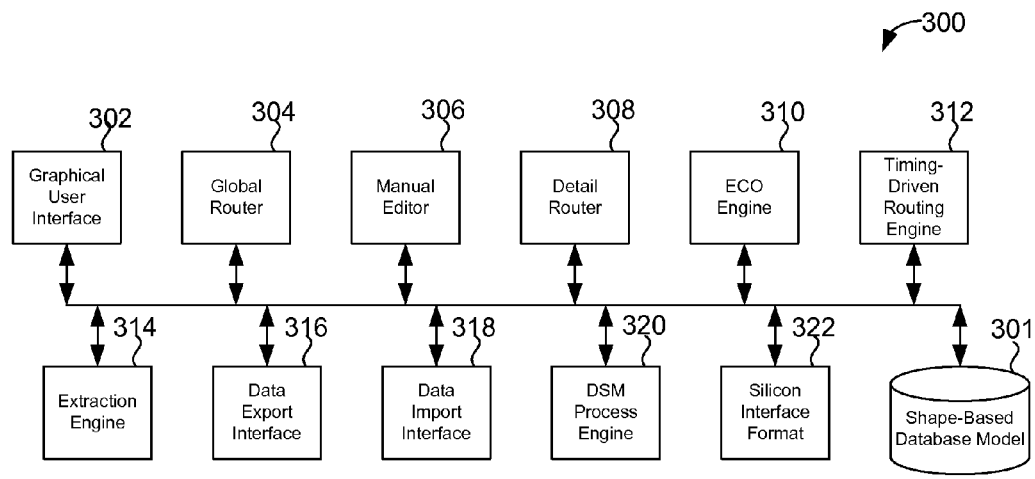
FIG. 3 shows a simplified functional block diagram of an exemplary EDA system incorporating aspects of the present invention.

FIG. 3 shows a simplified functional block diagram of an exemplary EDA system 300 incorporating aspects of the present invention. The EDA system includes a number of software tools, any of which may access a shaped-based database model 301 containing an integrated circuit design, or one or more portions of an integrated circuit design. The EDA system provides such tools as a graphical user interface 302, global router 304, manual editor 306, detail router 308, engineering change order (ECO) engine 310, timing-driven routing engine 312, extraction engine 314, data export interface 318, DSM process engine 320, and silicon interface format 322. An EDA system may include any number of the system tools shown in FIG. 3, and in any combination. Further, the EDA system may include additional tools not shown in FIG. 3.

An EDA system may be a grid-based system or shape-based system. Techniques of the present invention may be applied to a gridded or shape-based EDA system. A grid-based system relies heavily on the concept of a grid and routing grids. Gridded modeling, however, becomes difficult to implement successfully as the routing and feature sizes become smaller. The amount of data increases according to a square law, which means that tasks become increasingly more computationally complex and time-consuming as the amount of data increase. As feature sizes in integrated circuits continue to shrink, more features or geometries may be fitted into the same unit area of an integrated circuit. Therefore, it is important for an EDA system to handle increasingly complex integrated circuits and provide output or results quickly.

The techniques of the invention are especially suited for a shaped-based system, which may also be referred to as a gridless system. A shape-based system has no defined cell size. Each cell, or expansion area, is as large as possible. In brief, a shape-based system can expand edges, which means that an edge of an enclosing rectangle (or other polygon) may be expanded in the direction of the edge as far as desired until the edge finds an obstacle. This may be referred to as a "flood"

operation. The rectangle may be representative of any polygon of the integrated circuit, such as a net, contact, via, transistor gate, or transistor active area. Blocked edges are edges that cannot be extended because they are blocked by a perimeter of another rectangle, such as another segment, net, or obstacle. Once an obstacle is encountered, then a shape-based approach floods around the obstacle—making a ninety degree or other angle (any angle may be used) turns as needed to route around the obstacle.

Chip design, be it analog, custom or digital, will increasingly suffer from timing and signal integrity issues, and in particular crosstalk, as geometries continue to decrease and ever more fine wires are introduced. Gridded solutions are not flexible enough to resolve these issues, let alone achieve a high rate of routing completion. A high performance timing and crosstalk-driven routing solution will become a mandatory requirement in physical design. The grid-based approach offers fast routing but requires customization to handle off-grid connections and is inefficient for post-route timing and signal integrity optimizations. When net widths and spacings must be changed to reduce resistance or cross-talk, grid-based approaches waste space by moving nets to the next available grid and waste time by resorting to rip-up and re-route techniques if a move to the next available grid is not possible. Gridded systems are not good at irregular intervals, irregular spacings, or routing things that do not fit onto a regular grid. The gridless approach easily handles off-grid connections and is efficient for post-route optimizations. In a shape-based or gridless system, the layout may be a gridless layout, which means there is no grid which structures or polygon of the layout are associated with.

In an embodiment, the structure of database 301 facilitates shape-based operations. For example, a structure of this database may include an obstacle tree having nodes and leaves containing holds the obstacles of an integrated circuit. This tree structure permits rapid determination of where obstacles are when doing operations on the database, such as routing nets.

An specific example of an electronic design automation system is the Lyric Physical Design Framework™, made by Pulsic Limited. Lyric is a high performance auto-interactive IC physical design solution for analog, custom, digital, mixed-signal, embedded DRAM or SRAM, and system-on-chip (SoC) design. The system incorporates solutions for placement, routing, ECO, timing closure, signal integrity, and power routing. Another example of an EDA system is the Prelude Physical Design Framework™, also made by Pulsic. Prelude is an ultra high capacity, high performance IC physical design solution for very large digital/ASIC designs, running into millions of nets and cells. Prelude incorporates solutions for placement, routing, and ECO, powered by a scalable architecture, using a true distributed computing environment.

In FIG. 3, the EDA system 300 includes one or more of the components discussed below, in any combination. One skilled in the art will recognize that one or more of components shown in FIG. 3 may not be required to practice specific aspects of present invention. For example, when extraction engine 314 is omitted from system, the system could still perform spine routing of interconnection, but without RC extraction capabilities.

A graphical user interface 302 provides users a graphical interface in which to perform operations on the integrated circuit design. For example, the user can view the integrated circuit using the graphical interface. The user may use the mouse and cursor to select a particular polygon or feature, such as a net. The user may expand or zoom into areas of the integrated circuit design.

A global router 304 is an automatic routing engine that routs interconnects of the integrated circuit, thus enabling large designs to be routed more rapidly and completely. The global router may also provide visual and quantitative analysis of the congestion in the design by highlighting problem areas that can be fixed by incremental adjustments to the placement or floor plan. The global router is sometimes referred to as a coarse router because it provides generally the routes for the interconnect, and may work in conjunction with a detail router 308 (discussed below) to place the actual geometries of the interconnects.

A manual editor 306 is a shape-editing suite for creating or editing wires, metal, keep-outs, routing areas, and the ability to partition a design into smaller areas. These areas can then be worked upon individually and can be recombined at a later stage to complete the design. Full on-line design rule checking (DRC) ensures that manual operations are completed error-free first time. Tools may automatically push-aside existing wiring to make way for new wires and semi-automatic routing tools can quickly close down troublesome nets by allowing the user to guide the routing engine around complex areas of the design.

The detail router 308 is an automatic router that completes the wiring in a design by determining the specific routes for each interconnect. The detail router may complete a portion of the wiring for a design, such as for sections or specified cells of the design, or may complete all the wiring of the design. The detail router may route starting from scratch or from partially completed routing. In an implementation, the global router determines the general routes for the interconnect, and the detail router takes this routing information from the global router and puts in the specific geometries.

An ECO engine 310 provides a capability to handle late stage engineering change option (ECO) changes. Every element of the design should be modeled incrementally, thus eliminating the need to ever restart the physical design, no matter what changes may need to be made from upstream or downstream processes in the design. ECO engine capabilities can include the ability to shove or push cells aside to make space for new or relocated instances, and the ability to drop groups of components and automatically find legal placement sites for them, minimizing the disruption to the design. When pushing or pulling cells, the wires remain connected to the cells and the wires lengthen, shorten, and move as needed, if possible, to keep the connections. The detail router can then repair any violating interconnects and stitch-up any newly introduced interconnects, with minimum impact, ensuring circuit stability is never compromised.

A timing-driven routing engine 312 provides timing analysis of interconnects. Used in concert with the detail router, the timing-driven routing engine can determine the path of least delay for critical nets. Furthermore, the timing-driven routing engine, in concert with an extraction engine, can actively select a longer path with a lower associated delay (e.g., due to lower capacitance) in preference to a shorter but slower route.

An extraction engine 314 is provided. Utilizing a unified, high speed RC extraction engine, the crosstalk functionality accurately calculates the coupling between victim and aggressor signals. This same technology is then used to identify potential problems, and automatically implements a DRC correct solution without changing the path of the signal unnecessarily. In addition, signal-to-signal (or within and between classes of signals) spacing rules can be applied, and fully controllable automatic shielding can be used to protect particularly sensitive signals. The user is provided with unprecedented control over the resistance and capacitance in the signal path. Again, using the advanced built-in RC extraction technology, the user can separately control path resistance and capacitance, which is particularly useful for analog and mixed signal design.

In an implementation, the global router and detail router are linked to the extraction engine. So, for example, when running, the global router or detail router, or both, can call the extraction engine to obtain RC extraction information. The global router, detail router, or both, may use the RC extraction information when creating the interconnect routes. For example, the detail router may obtain RC extraction info from the RC engine in order determine whether an interconnect route meets current density rules, and widen the interconnect width as needed.

In a specific embodiment, the Lyric internal RC extraction driven constraints manager has been enhanced to ensure matching on a per-layer basis as well as the whole net or subnet. There is an increasing requirement in today's designs to match length, time, resistance and capacitance across nets on a per-layer basis. This ensures total net constraints are met as before but also guarantees designated nets can match on a per-layer basis.

The tightly coupled, high-speed RC extraction engine is used both during routing (global router or detail router, or both) and for post-routing extraction to reach timing closure in record time. Integrated timing analysis and curative features enable the management of delay within the design; the matching of delays within and between multiple nets; the sharing of delay between many nets in a signal path; and reducing the delay in critical nets by minimizing resistance and capacitance. Intelligent lengthening increases the delay of the faster nets, preventing shoot-through.

The detail router can address current density issues in analog design, to help achieve an optimum routing result for the entire design, and save valuable design time. The current information which is used to drive this current density functionality may come from, for example, a front-end schematic engine or simulation engine. The router can automatically route a net at varying widths to guarantee sufficient track widths at every point in the topology of the net to carry all current requirements. DRC and process checking tools can locate any insufficient width areas that may exist in any routing, including automatically generated routing, manual routing, and imported prerouting.

A data export interface 316 is provided so data of the EDA system 300 may be exported for other processes. For example, output from the EDA system may be passed through the export interface to other EDA systems or software tools provided by other manufacturers. The export interface would provide output in a form, format, or structure, acceptable by process or software tool which is being exported to.

A data import interface 318 provides the means to import data, such as a circuit layout, netlist, or design constraints. The data to be import may be in various formats including data saved from other EDA systems or software tools. In addition, the source of the data may be a database, floppy drive, tape, hard disk drive, CD-ROM, CD-R, CD-RW, DVD, or a device over a communication network. Some examples of import formats include text, ASCII, GDSII, and LEF/DEF.

A DSM process engine 320 is provided. The DSM process engine does design rule checking (DRC). Design rule checking locates and highlights where a design is breaking process design rules. For example, a design rule is the minimum spacing between metal lines (i.e., geometries on a specific layer). A design rule may be the minimum width of a metal line. A design rule may be a minimum polysilicon-to-diffusion spacing. There are many other design rules for a typical process. Some design rules are for checking geometries within a single layer, and some design rules are for checking geometries of two or more layers.

A silicon interface format 322 is provided, which in a specific implementation is an ASCII database format. However, in other implementations, other silicon interface formats may be used.

A user may design an integrated circuit using a system such as shown in FIG. 3. A representative flow for designing an integrated circuit is outlined in steps 1 to 7 below in table A. Step 5 is further subdivided into three substeps.

TABLE A

Integrated Circuit Design Flow

| | |
|---|---|
| 1. | Provide Circuit Specification |
| 2. | Create Circuit Design |
| 3. | Generate Netlist |
| 4. | Simulate Performance and Verify Functionality of Circuit Design |
| 5. | Generate Layout |
| 5a. | Layout Devices |
| 5b. | Connect Devices |
| 5c. | Connect Blocks of Circuitry |
| 6. | Physical Verification and Design Checking |
| 7. | Create Masks |
| 8. | Fabricate Integrated Circuit |

Although the steps above are listed in a specific order, the steps may take place in any order, as desired and depending on the specific application. These are general steps that may be applied to designing an integrated circuit including custom, a gate array, standard cell, field programmable logic, microprocessor, digital signal processor, microcontroller, system-on-a-chip (SOC), memory, ASIC, mixed signal, analog, radio frequency (RF) or wireless, and others. There may be additional or other steps, which may replace one or more above steps. Certain steps may be repeated. For example, after generating a layout for a circuit design, the step of simulating performance and verifying functionality may be performed again. This time, the parasitics and RC considerations from the layout cannot be backannotated into the netlist or circuit design, and the design simulated again. The results of this simulation will presumably be more accurate because more precise information is provided.

In step 1 of the flow, a circuit specification is provided. This is a specification or description of what the integrated circuit or circuit will do, and what the performance will be. For example, the integrated circuit may be a memory integrated circuit with particular address input pins and input-output (I/O) pins. Integrated circuit performance may be quantified terms in AC and DC performance. For example, AC performance refers to propagation delays, maximum clock frequency, clock-to-output delay, hold time, and other similar parameters. DC performance refers to maximum supply current, maximum and minimum supply voltage, output current drive, and other similar parameters.

In step 2, an engineer creates a circuit design that presumably will meet the circuit specification. This circuit design may include transistors, resistors, capacitors, and other electronic components. The engineer uses these electronic components as building blocks of the design, interconnecting them to achieve the desired functionality and performance. The engineer may make a custom design using electronic component building blocks or use a gate array, where the building blocks are a set of cells set by the gate array manufacturer. The design may be input using a graphical design tool such as schematic capture program, and any other design tool may be used. The circuit may be described using a high-level design language (HDL). These design tools will create a netlist (step 3) of the circuitry, which is a listing of the components of the devices and their interconnections.

During the design phase, the engineer simulates the performance and verifies the functionality of the circuitry (step 4). There are transistor and process models to model the components. Some simulation tools include Spice, which performs circuit simulation, and Verilog, which performs functional and timing verification. This is where the electrical information for current density routing is generated.

After deciding upon an initial circuit design, the engineer begins layout (step 5) of the circuitry. Layout refers to making the three-dimensional dispositions of the element and interconnections to make an integrated circuit. Making an integrated circuit is a layer by layer process. Some layers of an integrated circuit are diffusion, polysilicon, metal-1, metal-2, contact, via, and others. There may be multiple layers of the same material, but on different layers. For example, diffusion and polysilicon layers are used to make MOS transistors (step 5a). For example, metal-1 and metal-2 are two different layers, where metal-1 is below the metal-2 layer. These metal layers may be connected together using a via. Metal is typically used for interconnections (step 5b) and supplying power and ground to the devices.

Software tools may be used to help with the layout of the circuit, such as the automatic routing of interconnect (steps 5b and 5c). The interconnect may be between devices. Devices and circuitry may be grouped into blocks or cells having inputs and outputs. The interconnect may be between these blocks or cells (step 5b).

In step 6, after or while the layout is generated, the physical design is verified and design is checked. For example, some of operations may include layout-versus-schematic (LVS) checking, electrical rule checking (ERC), design rule checking (DRC), layout simulation (especially for analog circuitry), power analysis, and timing analysis. Physical verification and design checking is often iterative. Based on the design check, a design engineer or user may make changes to the design or layout, or both and the design may be rechecked in order to make sure any areas of concern or design errors have been cleared.

The result of layout is data (e.g., provided in GDSII format or other format) that is used to make the masks (step 7). The masks are used to fabricate the integrated circuit (step 7) using a photolithography process. Typically, there are many "copies" of the same integrated circuit fabricated on the same wafer. Each integrated circuit is a "die" on the wafer. Good dies are separated from the bad dies. The good dies are sawed and packaged. Packaging generally includes encapsulating the die in plastic or other material, and connecting pads of the integrated circuit to pins of the package, where the integrated circuit can be interfaced.

The invention provides techniques to automatically route nets in spine areas. The invention would help with steps 5b and 5c (routing interconnect) of the design process.

Applications incorporated by reference include: U.S. patent application Ser. No. 11/838,726, filed Aug. 14, 2007, which issued Jan. 17, 2012 as U.S. Pat. No. 8,099,700, which is a continuation of U.S. patent application Ser. No. 10/908,895, filed May 31, 2005, which issued Aug. 14, 2007 as U.S. Pat. No. 7,257,797, which claims the benefit of U.S. provisional patent application 60/577,850, filed Jun. 7, 2004, and U.S. patent application Ser. No. 11/530,613, filed Sep. 11, 2006. These applications are incorporated by reference along with all other references cited in this application.

Figure 4:
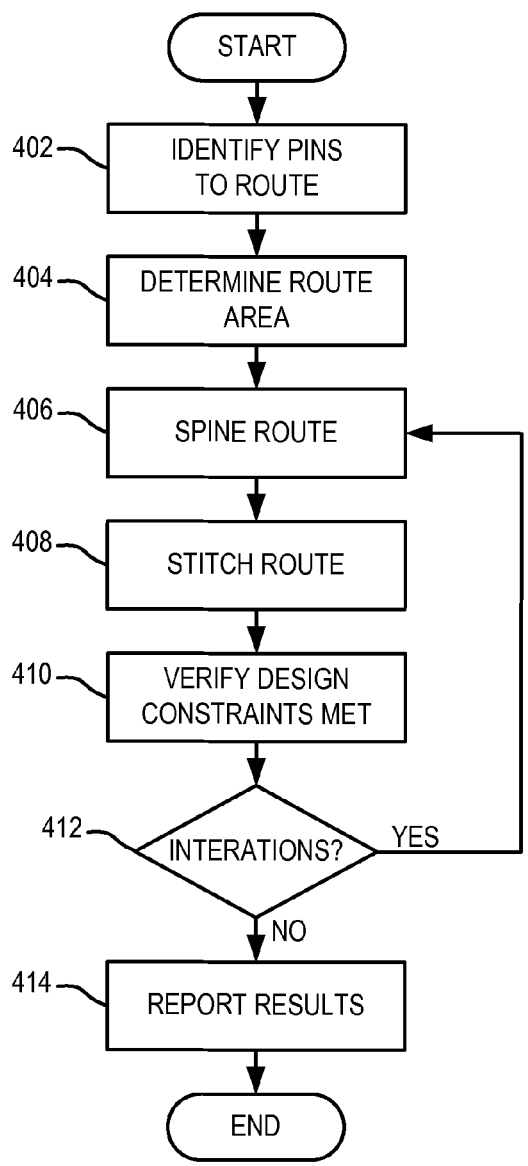
FIG. 4 shows a simplified flow diagram of routing interconnects according to an embodiment of the invention.

FIG. 4 shows a simplified flow diagram of routing interconnects according to an embodiment of the invention. In step 402, the system identifies the pins on a net to be routed. In one embodiment, a netlist can be used to identify the pins. Alternatively, a user can individually select pins to designate the net. Based on the disclosure and teachings provided herein, a person of ordinary skill in the art will appreciate how to implement to identify pins on a net. The system, in step 404, determines a route area which bounds the pins on the net. In one embodiment, the longer direction of the route area extends from the two most oppositely disposed pins on the net in the long direction of the spine.

A spine is a routing area that is long and relatively thin. It may also be referred to as a high aspect ratio routing area, where for example, the aspect ratio between length and width is 4:1 or greater. For example, the length to width ratio may be 4.5:1, 5:1, 6:1, 7:1, 8:1, 10:1, 12:1, 16:1, or even greater. An example of a routing area with a high aspect ratio is an area found between peripheral logic devices of memory array blocks in memory devices or devices with embedded memory. Another example of a routing area with a high aspect ratio is an area found in datapath design, such as in an arithmetic logic unit (ALU) or floating point processing unit (FPU) or a processor or embedded processor. Datapath designs will have these high aspect area routing areas as the number of width of the processor increase, such as 64-bit processors, 128-bit processors, and so forth.

Next, in step 406, the system routes a spine interconnect, that extends the length of the route area in the long direction of the spine. The placement of the spine interconnect with respect to the direction orthogonal to the long direction is determined as to avoid any obstacle and minimize the average length of stitching interconnects. In step 408, stitching interconnects are routed from pins to the spine interconnect. Stitching interconnects run directly in direction orthogonal to the long direction to minimize interconnect length, unless the stitching interconnects is required to take one or more detours to avoid an obstacle or satisfy a design constraint (such resistance, capacitance, or timing constraints).

The system as shown in step 410 verifies that the computed routing satisfies design constraints. In one embodiment, the system may change the spacing, length, or path of the interconnects so as to satisfy a design constraint. An instance where a design constraint is not satisfied is an error. In decision block 412, if further iterations of the routing are specified, the system reroutes the spine and stitching interconnections to eliminate or reduce errors. The number of iterations can be directly specified by the user (for example, one, two, five, twenty, or more iterations) or determined by an algorithm (for example, iterations continue until a best solution is found as determined by the number of errors, shortest average length of interconnects, or lowest cost). In step 414, the system reports the results of the routing. Reporting results can take many forms, such as outputting the routed net to a screen 5 or printer device, or saving data to a file for a design automation tool.

TABLE B

```
# A pseudo code description of a spine router
FOR channel IN channels
{
    net_list = process_net_list( channel );
    FOR net IN net_list
    {
        channel_route_net( net );
    }
}
```

TABLE B-continued

```
process_net_list( channel )
{
  FOR net IN channel
  {
    net.ideal_position = calculate_ideal_position( net );
    net.channel_rectangle = calculate_channel_rectangle( net ) ;
    add_to_net_list( net );
  }
  return net_list;
}
# The ideal position for a net is calculated to be the position that will result
# in the minimum amount of stitch routing.
# The channel rectangle for a net is the intersection of the rectangle that
# encompasses the items on the net and the rectangle of the channel itself.
channel_route_net( net )
{
  site_list = create_initial_sites( net ) ;
  WHILE length( site_list ) > 0
  {
    current_site = next_entry( site_list );
    obstacle = find_obstacle_overlapping_current_site( ) ;
    IF ! obstacle BREAK;
    new_sites = split_site_around_obstacle( obstacle );
    add_sites_to_list( new_sites ) ;
  }
  IF length( site_list ) > 0
  {
    current_site = next_entry( site_list );
    create_net_channel_routing( current_site ) ;
  }
}
# create_initial_sites(net)
# Creates a site whose rectangle is net.channel_rectangle for each layer
# in the channel .
# split_site_around_obstacle(obstacle)
# Creates two new sites either side of the original site as long as the new
# sites are wide enough to fit the channel routing.
# add_sites_to_list
# Sites added to the list are ordered by cost. The cheapest cost site being
first in the list.
# The cost is calculated using the distance of the site from the ideal
position for that net.
# An extra cost is added to account for the number of via that would
# need to be used to stitch the channel to the pins on the net.
# create_net_channel_routing( current_site )
# Creates the routing wire (or spine interconnect) for the net as close as
# possible to the net's ideal position as the site will allow.

# Note wires created become obstacles to subsequent nets along with
# existing database obstacles.
```

Figure 5A:
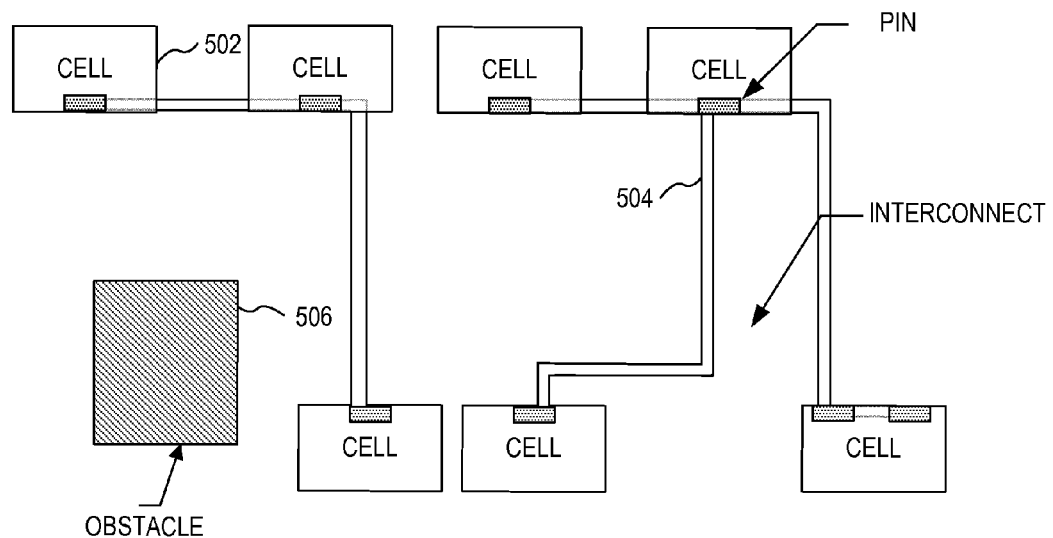
FIGS. 5(a) and 5(b) illustrate examples of interconnect routing by a traditional router and a router according to an embodiment of the invention, respectively.
Figure 5B:
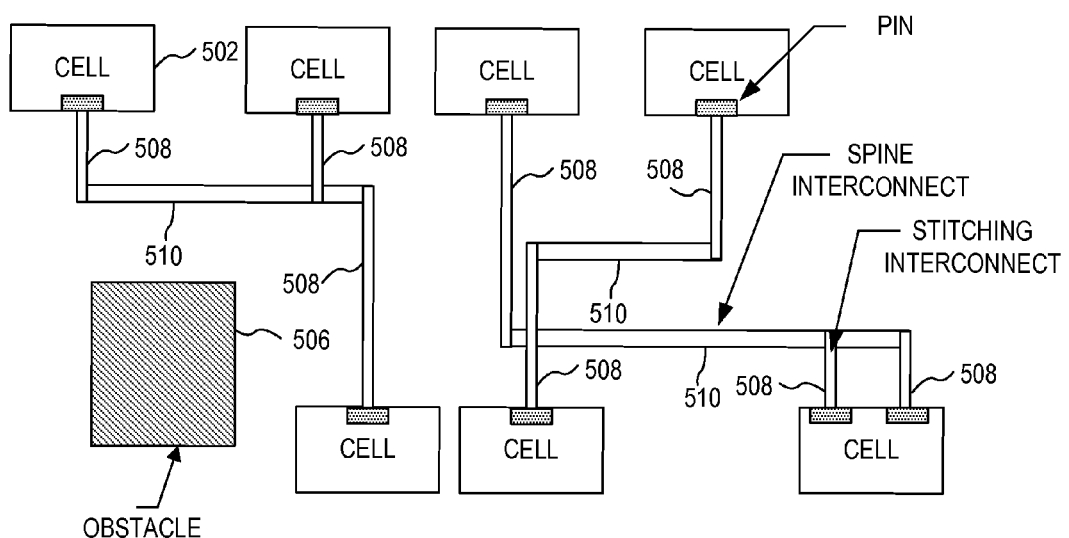

FIGS. 5(a) and 5(b) illustrates, by way of a simple example, some of the differences of interconnect routing performed by a traditional router and a router according to embodiment of the present invention (a "spine router"). FIG. 5(a) shows a minimal routing pattern to connect each net produced by a traditional router.

As shown in FIG. 5(b), the spine router places a shared minimal linear spine interconnect at a calculated position in the spine region (i.e., the vertical direction in FIG. 5(b)) for each net. For example, for each net, the spine router places spine interconnect 510 in the spine region. The position of spine interconnect 510 in the spine region is calculated to provide the shortest average length of a net's interconnects from its pins to the spine interconnect, or stitching interconnects. As a consequence, spine interconnect placement in the vertical direction is weighted to the side where there are more net pins. In our example, spine interconnect 510 is placed in the spine region to reduce the average length of stitching interconnects 508 for each net. Likewise, the length of each spine interconnect 510 along the direction of the spine, or priority direction, is the minimal length to provide for a straight, perpendicular stitching interconnects 508. Even so, it may not be always possible to route a stitching interconnect that is a straight, perpendicular interconnect. In some instances, a stitching interconnect may need to be routed with a minimum jog to avoid an obstacle 506 (such as, a cell, pin, or area outside a user designated design area).

FIGS. 6(a), 6(b), 6(c), and 6(d) illustrate the process of automatically routing a spine design according to an embodiment of the present invention. In this simple example, the spine router must identify pins of the net and define a route area within the spine region. It must also identify an obstacle (e.g., an area on specific layers that presents a restriction to routing or placement) and define the resulting forbidden area. Once the spine router has defined the route area and the forbidden area, it can route a spine interconnect and stitching interconnects.

Figure 6A:
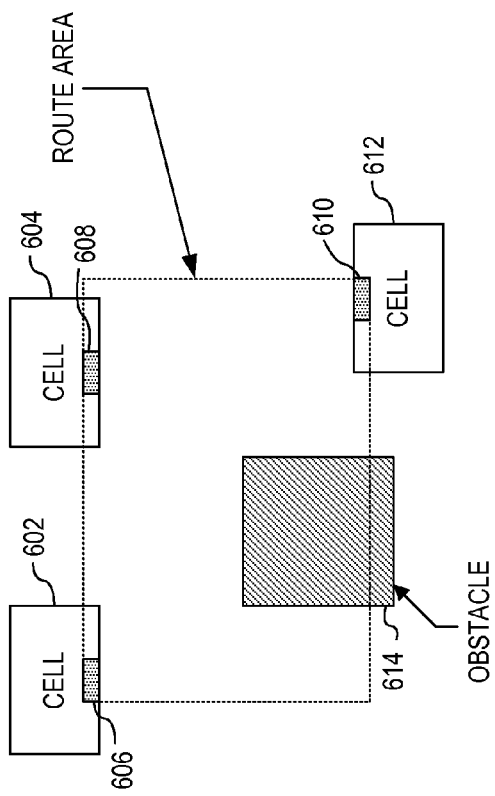
FIGS. 6(a), 6(b), 6(c), and 6(d) shows, as an example, steps for routing interconnects in a spine area for a single net according to an embodiment of the invention.
Figure 6B:
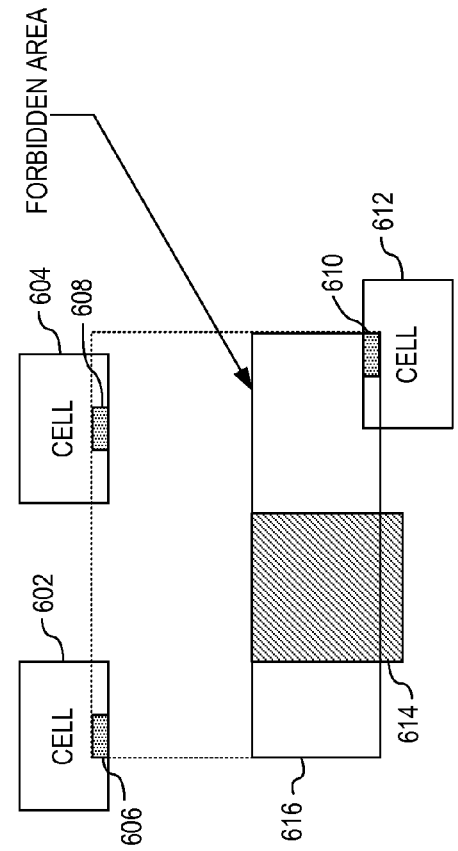

First, in this example, the spine router reviews a netlist, which specifies that pins 606, 608, and 610 of cells 602, 604, and 612, respectively, are to be connected. In FIG. 6(a), the router defines a route area 611 that encompasses pins 606, 608, and 610 and extends in the longwise direction, or priority direction, of the spine area from the two farthest apart pins, pins 606 and 610. Route areas are rectangular due to the desired orthogonality of spine interconnects and stitching interconnects. Next, the spine route identifies obstacle 614 within the route area 611. As seen in FIG. 6(b), the spine router defines a forbidden area 616 that encompasses obstacle 614 and expands the entire length of the route area 611 in the priority direction. The spine router will exclude forbidden area 616 for placement of a spine interconnect. Due to obstacle 614, any spine interconnect placed in a forbidden area 616 would fail to span across the entire route area.

Figure 6C:
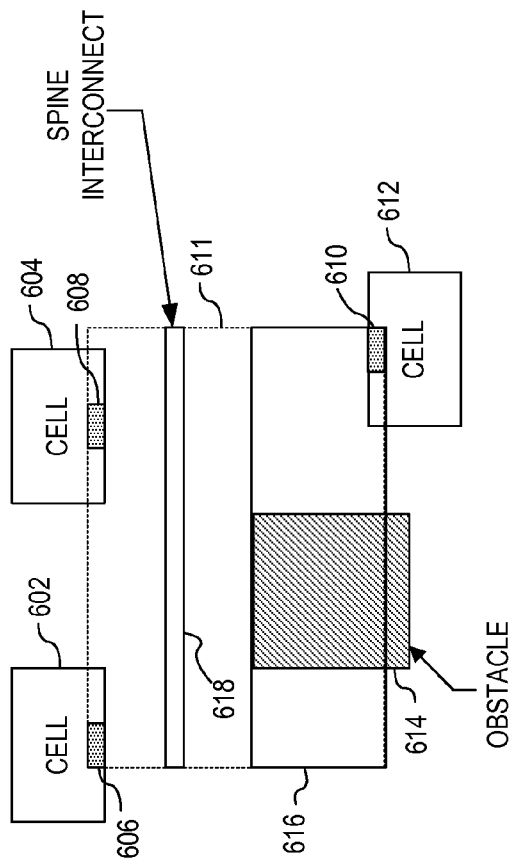

FIG. 6(c) illustrates placement of a spine interconnect 618 in route area 611. The spine interconnect should span the entire length of the route area in the priority direction to facilitate orthogonal stitching interconnects from pins 606, 608, and 610 to spine interconnect 618. Placement of spine interconnect 618 in a direction secondary direction (i.e., direction orthogonal to the priority direction) may be at any location outside the forbidden area 616. It is desirable for the spine to not have breaks (such as using vias and contacts to utilize different conductor layers), bends, or jogs, as would happen with routing with a traditional router, because such a straight spine provides better signal propagation. Therefore, the automated routing technique of the invention provides improved routing quality.

In an embodiment of the present direction, the spine router routes spine interconnect 618 to minimize the average length of stitching interconnects for the net. Minimized interconnects provide reduced signal delays for improved timing performance, reduced occupied surface area for smaller device package size, and reduced resistances for less device power consumption. The spine router calculates the average position in the secondary direction of pins 606, 608, and 610. If the calculated position falls outside forbidden area 616, a spine interconnect 618 can be routed at that location. Otherwise, the spine interconnect 618 can be routed at the closest location to the calculated position which is outside of forbidden area 616.

In our relatively simple example, the calculated position of spine interconnect 618 is, from the top of the spine, one-third the width of the spine. The position reflects the weighting of two pins at the top of the spine against the one pin at the bottom of the spine. In more complex examples with N pins on a net, the calculated position of the spine interconnect in the secondary direction can be described by the expression $(X_1+X_2 \ldots X_N)/N$ where $X_i$ is the position of a pin i in the secondary direction. In an alternative implementation, the calculated position of the spine interconnect in the secondary direction can be, or be about, the modal position of the pins on the net, or the position in the second direction that contains more individual pins of the net than any position.

There are many different techniques to place or position the spine interconnect so that it improves routing quality, and any of these techniques may be used. For example, some techniques consider an average or weighted average position, so that the spine is positioned closer to where there are more number of pins. Other techniques involve taking into consideration the modality. The highest mode is a position where there are the greatest number of pins in one place. Still further techniques take into consideration, not necessarily the highest mode, but the significant places where there are a large number of pins. A technique is to determine a spine position where the stitch connectors will line up to provide good route quality.

Figure 6D:
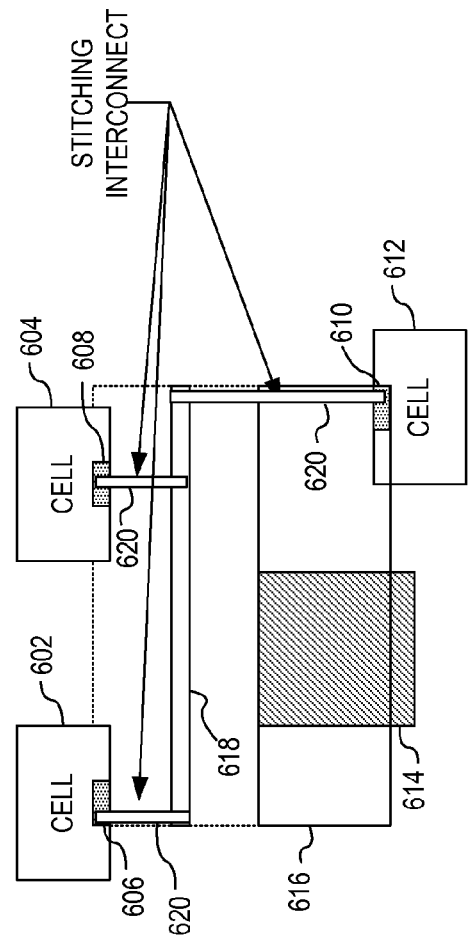

In FIG. 6(d), the spine router routes stitching interconnects 620 to connect pins 606, 608, and 610 to spine interconnect 618. In order to minimize interconnect length, stitching interconnects 620 are routed as straight lines directly to, and orthogonally with, spine interconnect 618. Pins 606, 608, and 610 are now connected as a net.

Figure 7:
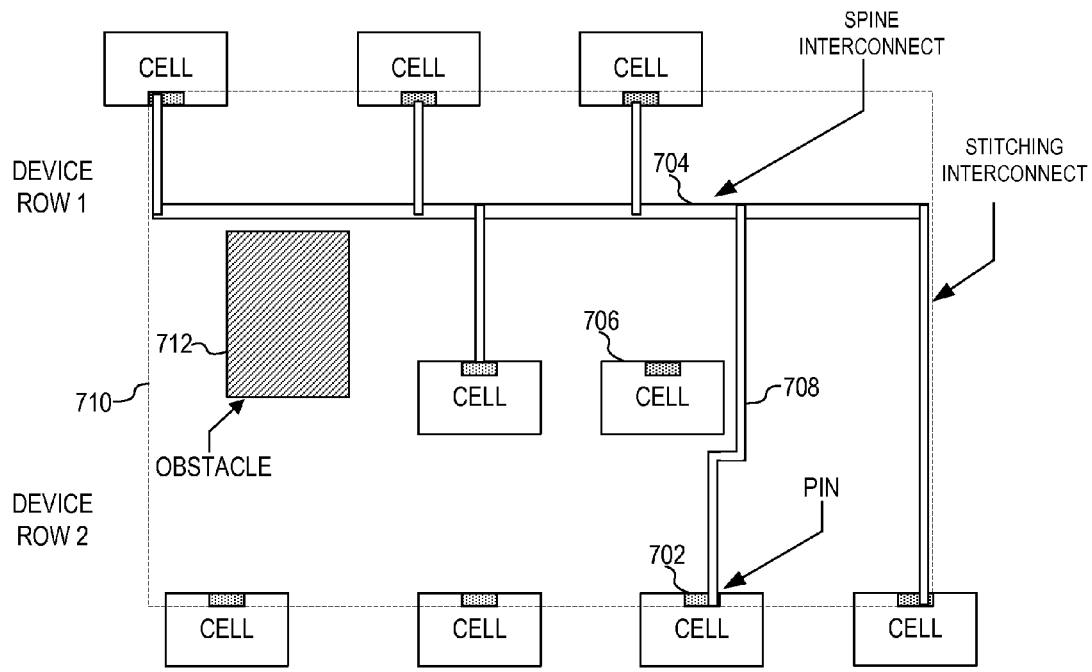
FIG. 7 shows, as an example, interconnect routing of a multiple device row design according to an embodiment of the invention.

However, when routing multidevice row nets, it may not always be possible to route a stitching interconnect as a straight line due to an obstacle (e.g., cell, pin, and others) in the path. In such circumstance, the spine router determines the least expensive deviation from the straight path based on a cost function. By and large, the resulting deviation will be a minimum jog to avoid the obstacle. As shown in the example of FIG. 7, the straight path from pin 702 to spine interconnect 704 is blocked by cell 706. According to an embodiment of the present invention, the spine router can route the stitching interconnect 708 with a minimum jog to get around cell 706. This minimum jog can be determined by a cost function based on numerous factors, including length of interconnect, capacitance of interconnect, and others.

FIG. 7 also illustrates that, other than stitching interconnect deviations, the spine router uses the same techniques for multidevice row routing as with single device row routing. For example, in FIG. 7, the spine router defines a rectangular route area 710 that encompasses all the pins to a net. Next, it identifies obstacle 712 and defines a forbidden area (not shown). The spine router calculates a trench interconnect position in the secondary direction based on the average position of the pins of the net. In this example, the calculated position falls within the forbidden area and, therefore, spine interconnect 704 is placed at the closest location in the secondary direction of the calculated position. From this example, it can be seen that techniques of the present invention can be applied to routing nets over 1, 2, 3, 5, 10, 20, or more spine areas.

In an embodiment of the invention, the spine router can automatically route one or more shields for designated spine interconnect. A shield is piece of metal neighboring, surrounding, or nearly surrounding an interconnect being shield to reduce the stray capacitances. Although typically at ground potential, a shield can be any predetermined potential with respect to ground. The spine router routes the shield with the same routing pattern as the spine interconnect separated by a small distance. In one embodiment of the present invention, this distance for each shield is calculated to be the minimum design rule checking spacing, or distance satisfying all design constraints, for such shield.

The shield is adjacent to the spine interconnect at either side or, alternatively, above or below. Exemplary shield configurations are shown in FIGS. 8(a), 8(b), and 8(c). FIG. 8(a) shows a pair of shields 804 on each side of an interconnect 802. FIG. 8(b) shows a pair of shields 808 above and below interconnect 806. FIG. 8(c) shows an interconnect 810 surrounded on four sides by shields 812. FIG. 8(d) shows an alternative embodiment using four shields 816 to surround interconnect 814. Additional shield configurations can be fashioned using 1, 2, 3, 4, or more shields per interconnect. In an alternative embodiment, the spine router may automatically route a shield with a separation distance below a specified design constraint if insufficient physical space is available. In yet another embodiment, the spine router can also shield a stitching interconnect using the same techniques.

In an embodiment of the invention, a spine router can route a bus. A bus is a set of nets that use the same routing pattern. Bus routing is typically used for address, datapath, and other timing-critical nets to ensure that all bits in the bus have very similar delay characteristics. FIGS. 9(a) and 9(b) show exemplary embodiments of automatic routing of shielding for bus interconnects. In this example, the bus includes bus interconnects 904, 906, and 908. The spine router automatically places shields 902 and 910 on each side of the bus. In one embodiment, shields 902 and 910 follow alongside the path of the bus when it travels in the priority direction of the spine, or the spine interconnects of the bus. In an alternative embodiment, shields 902 and 910 can be routed alongside the entire path of the bus. The spine router can also automatically interleave shields and bus interconnects. As illustrated in FIG. 9(b), shields 912, 916, 920, and 924 are routed to interleave each of the bus interconnects 914, 918, and 922.

Figure 10A:
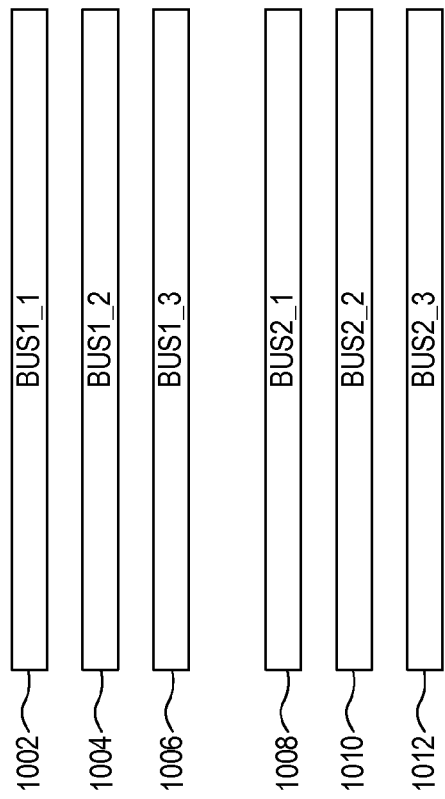
FIGS. 10(a) and 10(b) illustrate automatic interleaving of bus interconnects according to an embodiment of the invention.
Figure 10B:
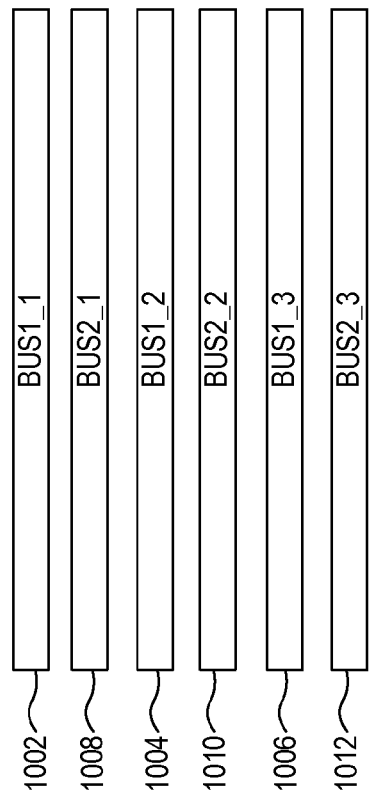

In an embodiment of the present invention, the spine router can automatically interleave a plurality of buses. Buses are interleaved to ensure that all bits in the two buses have very similar delay characteristics. FIGS. 10(a) and 10(b) illustrate automatic interleaving of bus interconnects according to an embodiment of the invention. As illustrated in FIG. 10(a) bus 1 includes bus interconnects 1002, 1004, and 1006, and bus 2 includes bus interconnects 1008, 1010, and 1012. The spine router can reroute bus 1 and bus 2 to interleave each bus interconnect of the two buses as shown in FIG. 10(b).

As the spine region can contain blockages (such cells and interconnects), spine interconnects can be routed using layer jumpers. For example, an embodiment of the present invention, spine interconnects can use layer jumpers to cross overlapping spine regions and hence overlapping spine interconnects in the same layer. A lower priority spine interconnect is moved onto a different layer, typically the stitching layer, for a small distance to cross over a higher region priority spine interconnect.

Figure 11:
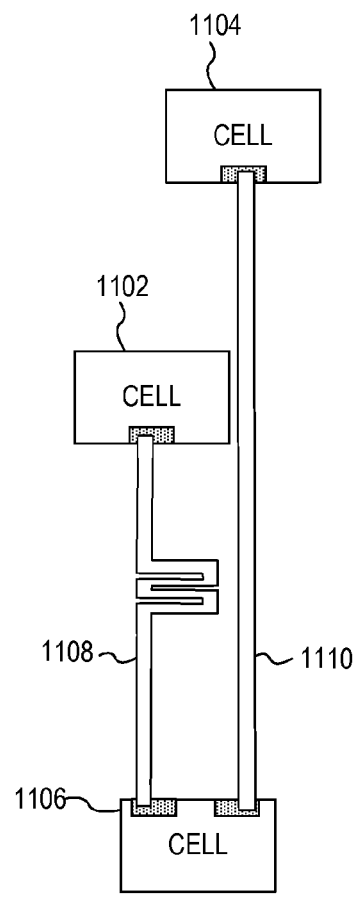
FIG. 11 illustrates automatic interconnect routing with time-based constraint matching.

In an embodiment of the present invention, the spine router can route a plurality of interconnects to match length, resistance, or timing. The spine router can perform constraint matching by adjusting: interconnect length, neighboring interconnect spacing, or a combination thereof. For example, the spine router can automatically lengthen a shorter net (such as by jogging an interconnect) to increase its length. FIG. 11 is a simple example of time-based constraint matching. If the time delay for a signal from cell 1102 to cell 1106 and cell 1104 to cell 1106 are constrained to be approximately the same, the spine router can automatically increase the length of interconnect 1108 to match the length of interconnect 1110. In more complex designs, the spine router can alternatively, or in combination, adjust the distance between neighboring interconnects to reduce stray capacitances, and thus improve time performance. Without time constraint matching, nets will inherently have different lengths, and therefore timing, due to the orthogonal nature of the spine, spine interconnects, stitching interconnects, and pin locations.

Figure 12:
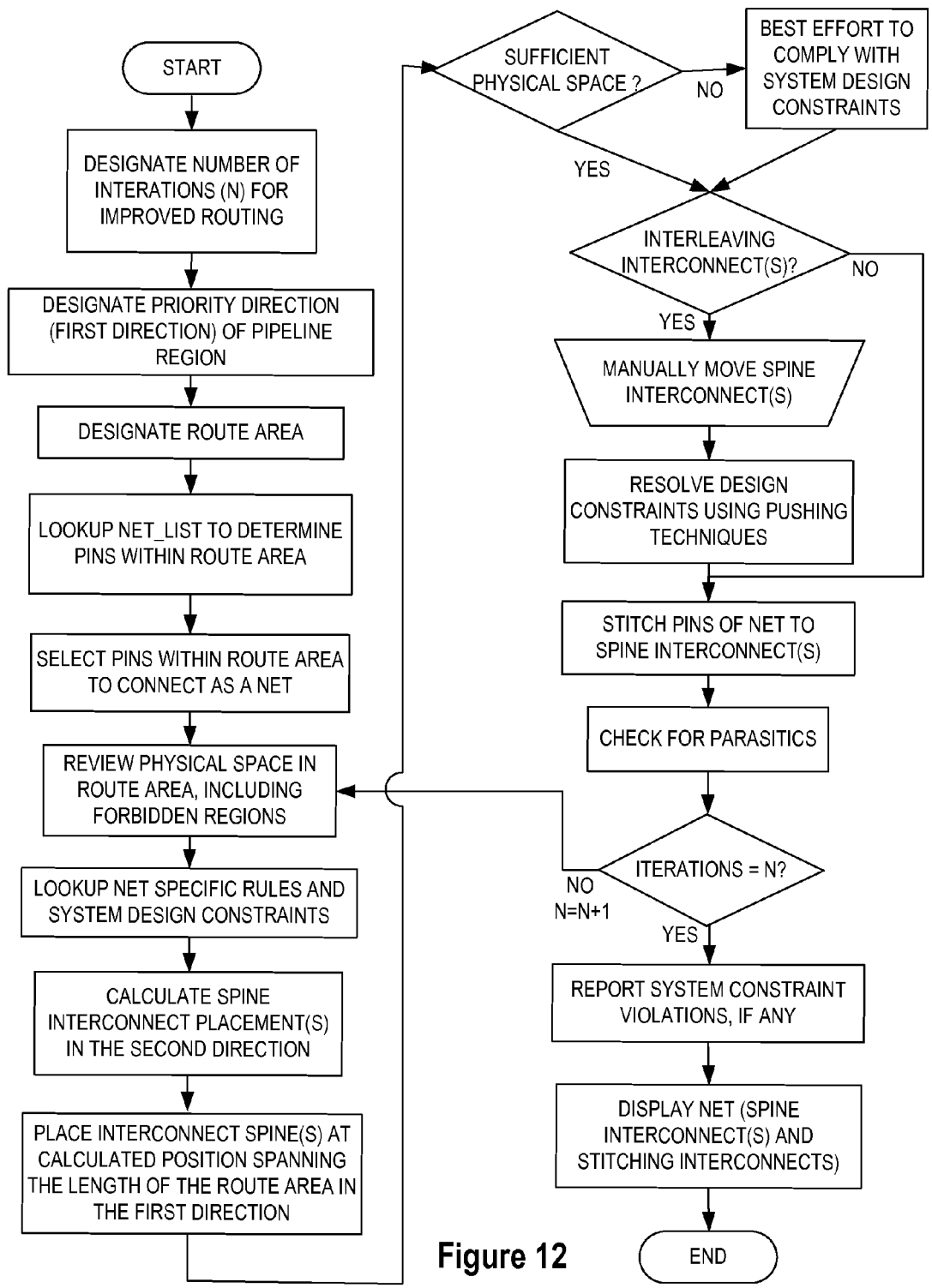
FIG. 12 shows a flowchart of routing interconnects according to an embodiment of the invention.

FIG. 12 shows a simplified flow diagram of routing interconnects according to an embodiment of the invention. The steps described in FIG. 12 are general steps that may be applied to routing interconnects in a spine region. The steps include receiving inputs, such as a number of iterations to be performed for improved interconnect placement, priority direction of spine region, and pins from netlist. Next, the spine router reviews the physical space in the spine regions, design constraints, and pin positions to determine spine and stitching interconnect placements. Interconnect routes can be adjusted by a user after routing. For example, as shown in FIG. 12, spine interconnects can be interleaved, which may involve manually moving the spine interconnects, or automatically interleaving the interconnects. The next step is to review the routing against design constraints, such as parasitics. If iterations are specified, the spine router can reroute interconnects to satisfy design constraints or improve performance. The spine router next displays the net and reports any design constraint violations. There may be additional or other steps, which may replace one or more above steps. Certain steps may be repeated. For example, additional steps may be included to automatically route shielding or match signal timing for specified interconnects.

Although specific embodiments of the invention have been described, various modifications, alterations, alternative constructions, and equivalents are also encompassed within the scope of the invention. The described invention is not restricted to operation within certain specific data processing environments, but is free to operate within a plurality of data processing environments. Additionally, although the present invention has been described using a particular series of transactions and steps, it should be apparent to those skilled in the art that the scope of the present invention is not limited to the described series of transactions and steps.

In a specific implementation, spine routing is applied to clock trees. For purposes of this patent, we categorize a clock tree implementation and generation into two main areas: (1) top level clock generation and (2) distribution and block level clock generation and distribution.

Most large digital integrated circuits (ICs) utilize clock signals to control the timing and flow of data through their digital circuits. During the IC design effort a netlist, which is an abstract model of the intended IC functionality based on library cell models and their interconnections is run through electronic design automation (EDA) tools that map the netlist to the ICs physical implementation. The main phases of this physical design process include floor planning, library cell placement, clock tree generation, signal routing, and physical verification.

This patent application focuses on improvements in the clock tree generation phase. Clock tree generation involves the buffering and routing of a clock signal from a root point to many (often thousands) of sinks (loads) that are spread across a large design area. Signal routing is necessary to make physical connections from the clock root to all the clock sinks Most clock signals have additional buffering and special routing because the clock signal's capacitive load is too great to be handled effectively by an ordinary buffer and ordinary signal routing.

Clock tree generation normally takes place after library cell placement. Library cell placement is usually an automated process that involves determining optimal coordinates for the location of each library cell, this includes logic cells, buffers, clock sinks and so forth. This invention mentions clustering techniques, but these clustering techniques involve clock sink groupings and their connections to clock buffers.

Once cell placement is completed the location of clock root which is the origin of the clock tree, and the clock sinks, which are usually registers, has been determined and then the information needed to automatically generate a clock tree becomes available. Clock trees are normally generated after cell placement is completed but before signal routing so that clock trees will have priority access to routing resources.

Some important clock tree quality metrics are as follows. Clock insertion delay is the time it takes for the clock signal to propagate from the clock root through the clock tree to the clock input pin at the sink at the end of the slowest path in the clock network.

Clock skew is the difference between the clock propagation delay from the clock root to the clock sink at the end of the slowest path in the clock network versus the clock propagation delay from the clock root to the clock sink at the end of the fastest path in the clock network. As clock skew increases design performance decreases.

Clock buffer count represents the number of clock buffers in a clock tree network. As the clock buffer count increases the clock tree's power consumption, routing resource usage, and total buffer area usually increase.

Dynamic power is related to signal switching. Dynamic clock tree power is defined by Capacitance*Voltage-squared*Frequency (CV*f^2). To minimize the clock tree's power, minimize capacitance, frequency, or voltage, or a combination of these. Voltage and frequency are often fixed by the design specification, which leaves minimizing capacitance, usually through more efficient buffering or routing, or a combination, as a common approach for reducing clock tree power. A related clock power reduction technique is clock gating, which involves preventing the clock network or branches of the clock network from switching by inserting clock gating cells that rely on control logic when associated logic is inactive.

Top level clock generation distribution usually involves relatively few loads spread over a wide area, where matched length routing and buffering is typically employed to distribute the clock and minimize skew. Block level clock generation usually involves buffering and distributing a clock signal to many loads that are within a fixed block area.

Assuming the design is being implemented hierarchically, the block level clock tree would be generated within the block in a standalone manner. During top level integration, the block's clock pin would be connected to the top level clock tree, and clock buffers used to balance delays would be added to the top level clock tree to insure the total propagation delay to the block's sink loads closely matches the total propagation delay to clock sinks located in other blocks or other sinks, or both, located at the design's top level.

There are also cases of flat designs that contain a mixture of top level clock distribution along with regions having block-like clock distribution. For this discussion, top level and block level clock generation will be treated separately, since top level clock generation largely involves matched signal distribution and buffering, while block level clock generation largely involves automated insertion of clock buffers and routing to many loads while minimizing the clock skew.

Two main approaches can be used to generate large block level clock trees: (1) clock tree synthesis (CTS), and (2) clock mesh. CTS tools buffer and route a clock to a centrally located point and then insert and distribute levels of buffers throughout a design to drive the clock signals to destination sinks. The CTS buffers are relatively small and widely distributed, making CTS very flexible.

Figure 13:
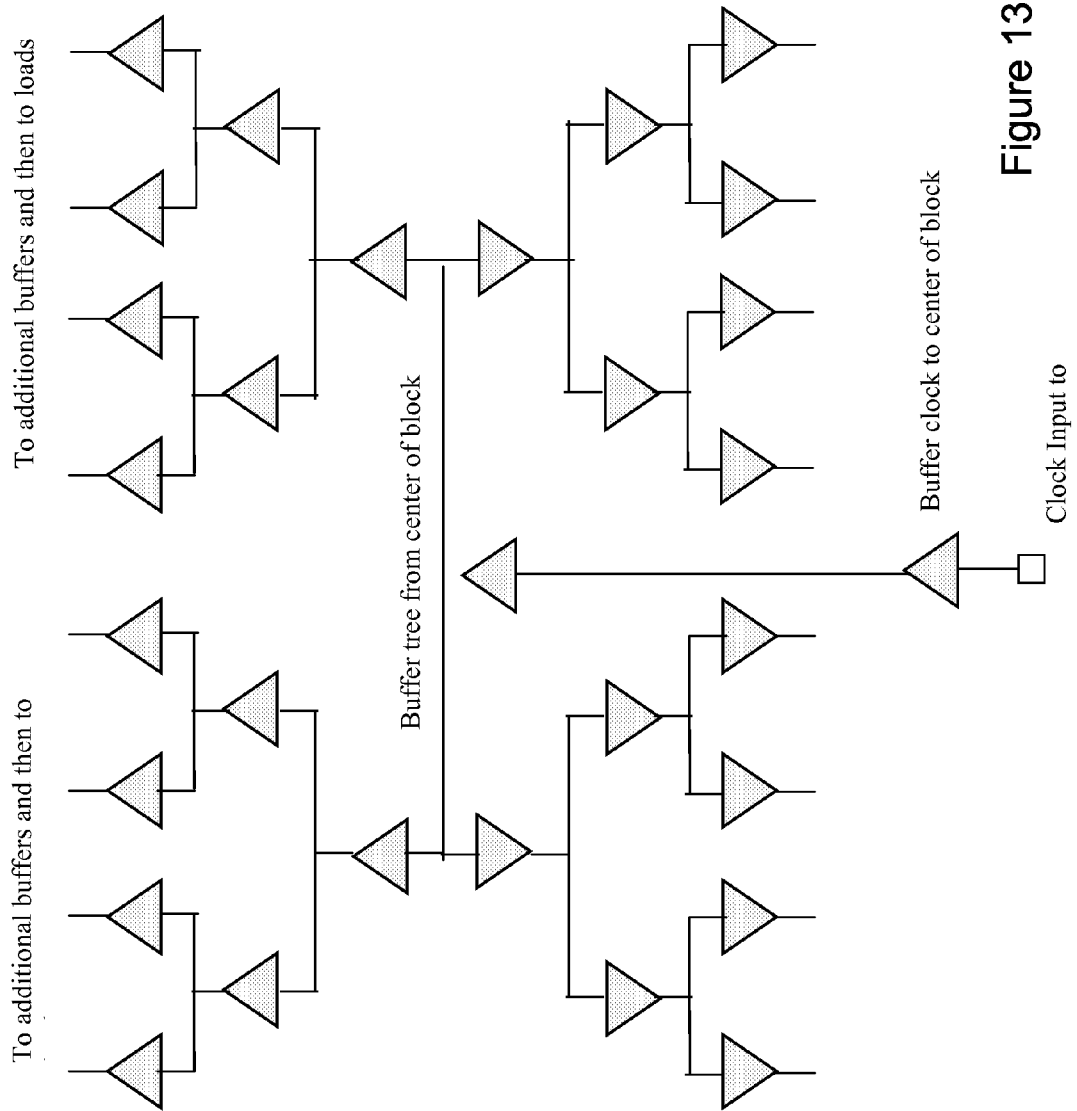
FIG. 13 shows a simplified example of a CTS clock tree.

FIG. 13 shows a simplified example of a CTS clock tree. A simplified example of a CTS clock tree. The clock signal is usually buffered from the block's clock input pin to the center of the block, from there clock branches are buffered and distributed in both X and Y across the block. Many more buffer levels are typically needed than shown in this figure.

As a down side large CTS clock trees with say 100,000 loads often use 15 to 20 levels of buffers to distribute and buffer the clock signals. This results in large insertion delays, which increase OCV timing penalties and the clock skew. The distributed nature of CTS supports very fine grained clock gating for minimizing dynamic clock power. CTS clocks are often used in digital ASIC designs, due to their more digital nature and more random architectures.

The clock mesh approach utilizes a large centrally located clock buffer that is often comprised of many smaller buffers placed in parallel. This large buffer drives a wide low resistance centrally located spine or a set of parallel spines, the spines in turn drive perpendicular mesh branches that are distributed throughout the design area. These branches are connected to directly to the sink loads or to local clock buffers that then drive the sink loads. A clock mesh typically uses only 2 to 4 layers of buffers, even for huge clock trees, so the insertion delay is usually small and both OCV timing penalties and clock skew are relatively small.

Figure 14:
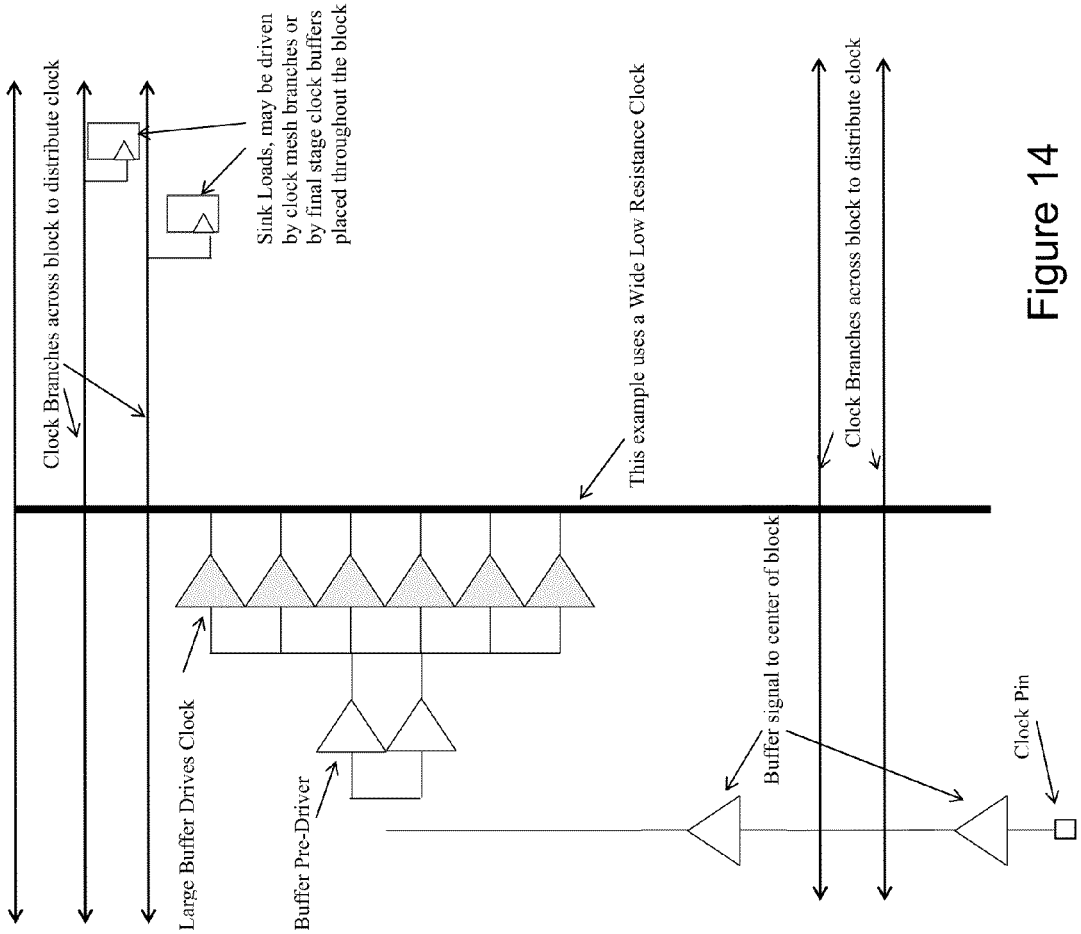
FIG. 14 shows a simplified example of a clock mesh tree.

FIG. 14 shows a simplified example of a clock mesh tree. The clock input signal is buffered to the center of the block and then drives a predriver that drives the larger buffer that drives the central clock spine. The spine then drives clock branches that finally drive the clock sink loads. FIG. 14 is sparse to improve readability.

Many digital place-and-route tools have difficulties modeling timing for parallel buffers driving a common node such as the clock tree spine or a distributed clock mesh. This often results in convoluted flows for clock mesh designs. Furthermore, since clock mesh often relies on parallel buffers, it is a poor fit for fine grained clock gating. Mesh clocks are more likely to be used in high performance designs such as processors, which tend to use more customized design flows.

At a high level CTS clock trees involve building a clock distribution network using a binary topology, and recursively splitting the tree from the root or source node out to all the sink loads. This entails a bottom-up stage where sink loads are grouped or clustered and possible merge nodes, which are potential future buffer insertion points in the clock network, are identified. There is also a top-down stage where the clock net is distributed from the source node, and the exact merge points are chosen, and the clock buffers are inserted into the netlist. The buffers are then physically placed and the clock network is routed. Some CTS techniques include sink clustering, clock tree construction, and balanced routing.

Figure 17:
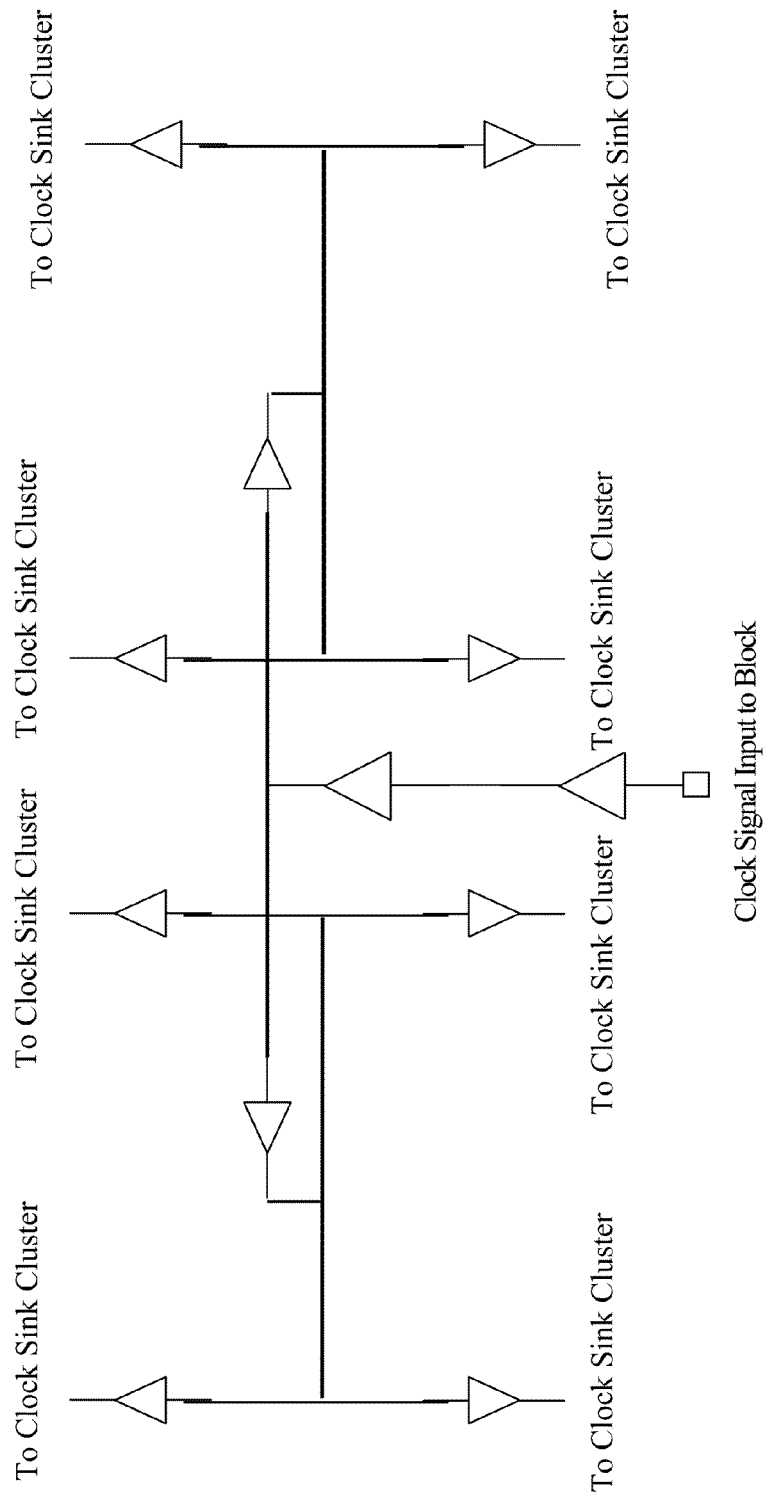
FIG. 17 shows a simplified example of balanced routing.

FIG. 15 shows a simplified example of sink clustering. FIGS. 16A-16D show a simplified example of clock tree construction. FIG. 17 shows a simplified example of balanced routing.

Next various routing adjustments are made to fine tune the clock network timing and reduce clock skew. The clock network routing delays to the sink loads near a block's center would normally be shorter than delays to more distant loads at the edges of a block. Various clock routing and buffer placement timing adjustments are preformed to help minimize clock skew. Once the slowest clock paths can no longer be sped up, the faster clock paths are then slowed down to match the slowest paths and thus minimize clock skew. This has the down side of consuming more routing resources and using more buffers. Also note, the number of buffer levels for a clock signal between the source node and all sink loads is normally matched. For example, there should be say 18 levels of buffers from the clock root node to all sinks. This is performed to improve timing correlation over process, voltage, and temperature (PVT).

The above approach is straightforward, but often suffers from delay modeling issues for large clock trees. Exact routing information about nonclock signals is not in place when the clock tree is being synthesized, so it is not efficient to run accurate 3D resistance-capacitance (RC) extraction during the CTS design step. It follows that much of the capacitance modeling during CTS is estimated, so buffer input and output slew rates are inaccurate, and clock network delays to sink loads are often inaccurate. The clock skew reported by CTS tools may look very reasonable, but it is based on estimated delay models.

During subsequent design flow steps, the clock skew typically degrades, due to the addition of actual signal routing with associated capacitance along with the use of more accurate extraction tools. Even if, for example, 99 percent of the nets in a complex CTS clock network with, for example, 5000 nets have reasonable timing behavior throughout the design flow, the remaining 1 percent (or 50 nets), may have timing issues and can be difficult to fix.

Mesh Clock Tree Details. Digital EDA tool support for mesh tree generation has traditionally lagged support for CTS trees. The main design issues involved with the clock mesh approach include: determining the mesh-buffer topology, sizing the main clock buffer and prebuffers (if used), determining the width of the clock spine, and sizing the width of the clock branches. The spine and the branches are normally on the two highest available routing layers, which for many ASIC processes has thicker metal with lower resistivity.

Either EDA tools or semiautomated scripts are often used to place the buffers and create the clock spine and branches. A heuristic approach is often used for the initial buffer, spine, and branch sizing, and this is then fine-tuned to obtain the targeted timing results. The final routing from the branches to the sink loads is done with an automatic routing tool. For cases where sink loads aren't placed all the way to the edge of the blocks, the clock branches are usually trimmed (automatically or by script) back to the location of the outermost load to help reduce the clock tree capacitance.

A variation of the clock mesh implementation involves distributing a final stage of buffers throughout the block, near the final sink loads. This approach can be used to support fine grained clock gating, where the clock gating cells would be placed along with the final stage buffers. A high performance mesh variation involves distributing the final stage buffers throughout the block and matching the routing distance from those buffers to the central spine to further minimize clock skew. In this case multiple clock buffer outputs would drive the same clock tree branch, this increases total cross over current, but helps minimize the overall clock skew.

Many other topologies are also possible. For example, rather than using a central spine, the clock branches could be interconnected to produce a fine grained mesh fabric which would help reduce skew. There are some additional mesh topologies and buffer distribution schemes. This classifies some various common mesh topologies.

For typical mesh implementations the number clock buffer levels should remain relatively low, minimizing the insertion delay, skew and OCV effects. However, STA-based timing analysis becomes more difficult as the mesh grows more complex. Furthermore, clock mesh routing overhead is often relatively high.

Aspects of the invention support both hierarchical top level and block level clock tree implementations. To simplify this invention description, the focus is largely on the implementation and generation of one top level and block level clock tree that corresponds to one clock signal. This is not intended to imply that this invention is limited to support the implementation of only one clock tree within an integrated circuit. This invention will support implementation of multiple clock trees within an integrated circuit.

From a design perspective clock sinks are associated with the clock signal that is connected to their clock input pins. When this invention description mentions clock sinks it implies clock sinks that are tied to the same clock tree, other clock trees and their associated clock sinks would addressed separately. Regarding a typical design flow a designer would complete cell placement, than work on implementing all the clock trees, which would be done serially or in parallel depending upon the design and design flow. Once all the clock trees have been implemented signal routing work could then begin.

Top Level Clock Tree Implementation. A technique balances delays for clock branches going to blocks with differing internal propagation delays. A mechanism such as a GUI interface that uses customer inputs to guide the clock balancing effort is available. For example, a customer could specify the buffer type, and the top tree topology ("L," "H," and so forth) and the rough locations for clock buffer insertions used to distribute matched length clock routing to all top sink loads. Additional clock buffer insertions to balance delays to different blocks may also be used. Providing a way for users to way to indicate where these buffers should go would be helpful. For example four serial clock buffers may need to be inserted before the clock pin of the block with the fastest insertion delay.

In addition, the designer should specify the clock signal routing information such as: layer, widths, spacing, optional shielding and so forth. Once the clock signal routing guides are in place the next step would be to specify the clock buffer type, and the approximate locations for buffer insertions needed to distribute matched length clock routing to the top level sink loads. Actual routing and insertion of clock buffers would be automatically generated based on the guide based inputs.

It is also a good design practice to balance the delays for clock branches going to lower level blocks (modules) with differing internal propagation delays in order to minimize clock skew as seen from the top level root clock pin(s). It is assumed that one who is skilled in the art should be able to produce a reasonable to level clock topology and buffering plan and balance clock insertion delays to lower level blocks.

As clock trees grow larger, the need to distribute high fan-out nets will also increase. Designs that have clock trees, may also contain other high fan-out net such as reset nets, scan enable nets, power control nets, and others. Top level clock routing capabilities also support top level high fan-out net routing and buffering. A topology sketcher plus buffering capabilities or the like may be used.

A technique for block level clock trees will produce small clock block level trees that use a correct by construction approach that meets timing requirements while consuming minimal placement and routing resource.

Figure 18:
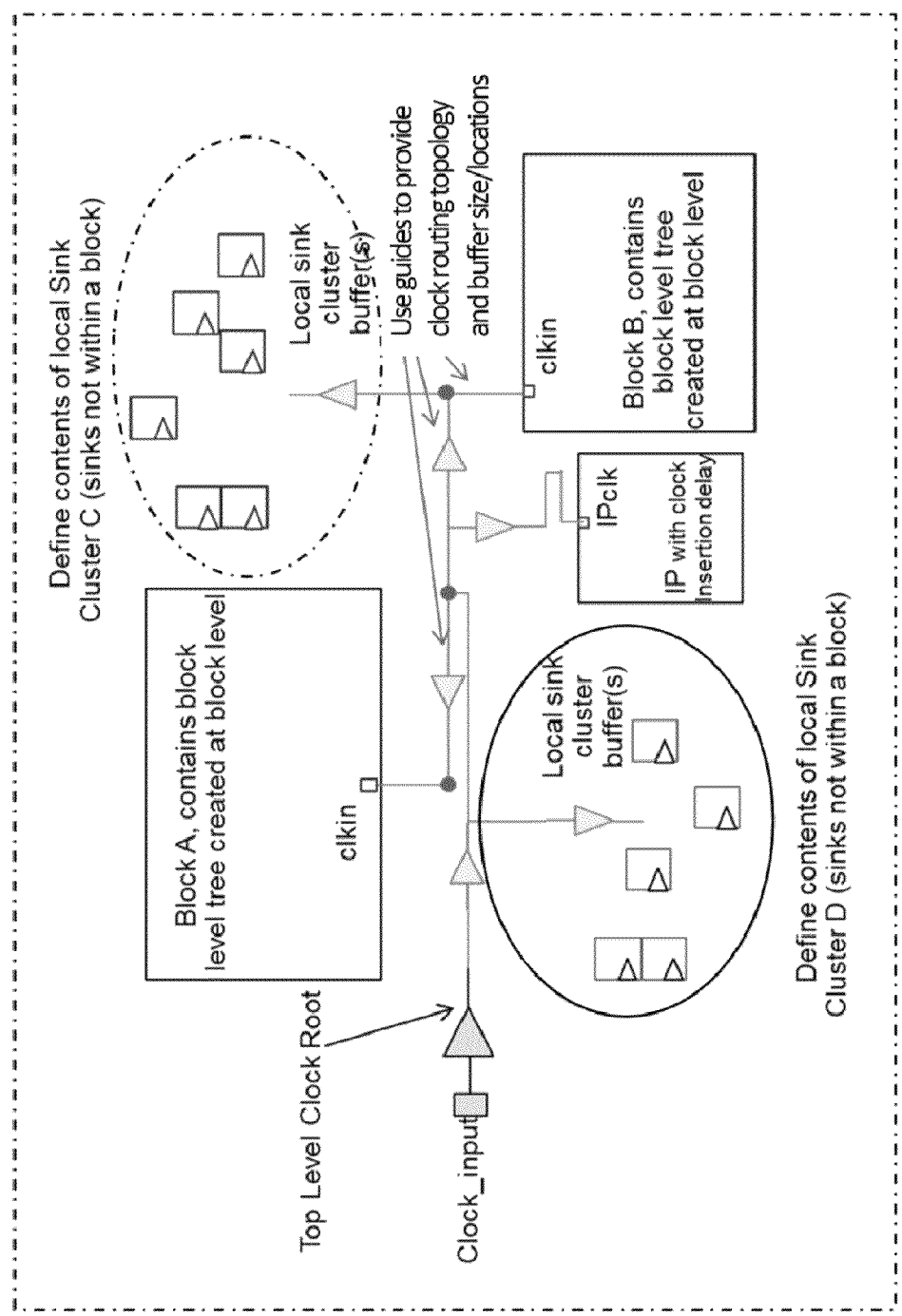
FIG. 18 shows an example of top level clock tree implementation.

FIG. 18 shows an example of top level clock tree implementation with a clock root buffer output pin, that drives a matched length buffered signal going to clock inputs of two lower level blocks, a standalone IP, and two local sink clusters, which are groupings of clock sinks not within a lower level block.

The clock signals going to the local sink clusters, refer to examples shown in FIG. 18, would be need to be buffered and routed to the input pins of all the clock sinks within each sink cluster. Local sink clusters can be viewed as small independent CTS style clock trees with distributed buffering.

If local sink cluster tree implementation is automated, merge nodes would be identified, buffers inserted into the netlist and physically placed into the physical layout and then routed to the clock sinks Optimal clock buffer placement typically involves placing the buffers such that the total routing distance to the destination sinks is minimized.

For most ASIC designs, CTS clock tree implementation, which involves clock signal buffering and routing, is determined by design automation software or by user parameters that define the buffering scheme throughout a block, which implies the buffering scheme would be the same for the branches within a block.

For an implementation of this invention, local cluster clock buffering and routing could be fully automated or the buffering plan could be based on inputs from a cluster buffer table. See examples in FIGS. 19A, 19B and 19C (and accompanying FIGS. 19D, 19E, and 19F), or by using similar parameter input mechanism. Once the buffers are placed, the local sink cluster clock can be routed using a suitable automated router if, available, since this is more efficient than routing by hand. A local sink cluster buffer table effectively provides buffering plans for individual clock tree branches and thus provides low level buffering control.

Many design and process dependent factors such as clock buffer drive, routing resistance, routing capacitance, sink input capacitance, performance requirements and so forth are involved in determining a reasonable local sink cluster buffering implementation. As the number of sinks increases the number of final stage clock buffers driving the sinks tends to increase. As the separation between the sinks increases, the routing lengths and routing delays increase, so more buffers are often needed.

Increasing design performance tends to require faster clock propagation times, so larger buffers or more buffers are needed to provide more drive. Often for very small local sink clusters, those with, for example, less than 25 sinks, one large clock buffer may provide sufficient drive and performance. If the number of sinks is less than, for example, 100, then four large parallel buffers may provide sufficient drive and performance. As the load count increases above say 100 loads, a first level buffers are often needed to drive multiple second level buffers see example FIG. 19C. For still larger sink counts, three stages of buffers are often needed see example FIG. 19B.

It is a good design practice to traverse the same number of buffer levels from the root clock pin through the clock network to all clock sink pins to improve delay matching over PVT. Local sink clusters with greatly differing sink counts may appear to require differing levels of clock sinks. However, buffer levels should be added to the shallow local sink clusters to improve delay matching with deeper local sink clusters. FIG. 19A appears to have a redundant buffer level, which would be needed to match a two buffer level implementation such as that shown in FIG. 19C. One who is skilled in the art should be able to produce matched buffering implementations for small local sink clusters.

Additional clock buffers may need to be inserted to balance delays to different blocks below the top level of the tree. This could be done by hand or by using an interactive GUI mechanism to target where these buffers would be inserted. For example, two serial clock buffers may need to be inserted before the clock pin of a small block with a three level clock tree to match the insertion delay of a larger block with a five level clock tree.

Block Level Clock Tree Implementations. The block level clock tree embodiment relies on preexisting custom design automation spine and stitch based routing capabilities. The clock spine would be similar to the spine used in mesh clock implementations, but rather than driving a mesh structure, the spine would drive local sink clusters as shown in to FIG. 15.

These local sink clusters would be buffered automatically or according to designer specified clock buffer table inputs. An approach would be to automatically route the local clock trees after adding the clock buffers. For many implementations the clock spine would be routed in the routing resource limited direction, perpendicular stitch routes going from the spine to the sink clusters would be added in a not resource limited direction.

If needed the spine route could be widened, have greater spacing, or shielding, or any combination of these, to improve clock signal propagation and reduce the clock skew. A larger buffer, or parallel buffers, could also be used to provide more drive and provide faster spine rise or fall times especially when widening the spine, which reduces spine resistance while increasing capacitance. One who is skilled in the art should be able to understand the design tradeoffs and produce a clock tree spine that is appropriate for their application.

In cases where the spine length becomes too large, which can cause excessive clock skew, the spine route could be split into matched length buffered segments that would reduce the clock skew. See FIG. 17, which shows the spine being split in half, and implemented with matched buffering and routing. The spine could also be buffered and split in fourths, eighths, and so forth. In other embodiments parallel spines connected by a center segment, which would form an "H" shape could be used to distribute a clock signal over a larger area.

Clock Spine Implementation. A spine and stitch capability provides an excellent starting point for building the spine for a small clock tree. This spine would be especially useful for minimizing routing resource usage in the most critical routing direction. Meanwhile, excess routing resources in the non-critical (stitch) direction could be used to support local buffering and help balance the clock network delays and skews. See FIGS. 15 and 16A-16D. If needed the spine route could be widened, have greater spacing, or shielding to reduce the skew, or any combination or these. In cases were spine routing distance is too large and causes too much skew, the spine route could be split into matched length buffered segments that are routed with the channel router. See FIG. 17.

Sink Clustering. The CTS based sink load clustering approach can include netlist-aware placement features, in which cells are grouped or clustered according to the netlist hierarchy. In this manner the sink clusters could be based on netlist-aware sink (e.g., flip flop) placement. By extension, a system can provide a probe feature for nets to probe the clock clusters, which would make it easier for users to view their sink cluster contents and the locations. The system can provide a graphical user interface (GUI) capability for customers to review and update their sink load clusters, so they could add or remove clusters and or shift sinks from cluster to cluster when needed. This approach would help reduce power consumption if clock gating is being used because sinks sharing common gating logic could be placed in the same cluster (clock branch).

Providing a capability for users to define number of sink clusters at the outset along with ranges for the number of sinks or cluster would also be helpful. Once the sink clusters have been defined or identified, local clock buffers would then be added to each sink cluster.

In the simplified case there would be one clock buffer per cluster, as shown in the example in FIG. 15. Having one buffer per cluster would support relatively small clock trees, so if there were say 8 clusters. If each one has one clock buffer that drove 25 loads that would represent 200 total loads. If needed, clock buffers could be used in parallel to potentially reduce propagation delays and/or drive larger clock sink clusters. See FIGS. 16B and 16C. By extension, having two levels of buffers per cluster, where a first stage clock buffer drives several second stage clock buffers could then be used to drive even larger sink clusters. See FIG. 16C. This approach could also be expanded to use three levels of buffers.

After the clusters are defined, their local clock buffers are inserted and routed to the local clock sinks. Next, these local sink buffers would be stitch routed to the clock spine. Additional stitch routing could to be added to match the routing delays for buffers that are differing distances from the center of the spine and reduce the clock skew.

Overall the above block level clock tree should minimize buffer count and routing utilization along with clock insertion delay and clock skew. The above approach would be correct by construction and the results would be reproducible and be consistent.

Load Sink Clusters. The local sink cluster content has a significant impact on the quality of clock tree implementations. Designers should set the number of sink clusters needed for their block. Alternatively software could automatically determine the sink cluster count, but this would reduce the designer's control. Factors that determine a reasonable sink cluster count include the total number of sinks, the target number of sinks per cluster, the density of the sinks within a given area and so forth.

In general there would be a single sink cluster for block level clock tree implementation without a clock spine, which would be the case for relatively small clock trees. There would be four or more sink clusters (two or more above the spine and two or more below the spine) in implementations that have a clock spine. It is possible to have blocks with hundreds of sink clusters, although as the number of sink clusters increases their associated design overhead increases.

Many implementations would probably have between say 4 and 16 sink clusters since that wouldn't significantly increase the design complexity, while providing ample control of the block level clock tree implementation. Also note the local sink clusters could become larger and containing more clock sinks, in cases where it is easier to work with fewer-larger local sink clusters. Regarding design automation, an auto-cluster function could be used to automate the first cut of sink cluster groupings, based on the local cluster count, a target range for the number of sinks/cluster, plus a mixture of physical location and netlist interconnectivity. As an alternative, the sink clustering could also be done by hand.

As the amount of logic that connects between the clock sinks within a local sink cluster increases, the clock tree buffering implementation and potential clock gating implementation will improve because the clock tree branches effectively contain greater amounts of common logic. The library cell placement step determines the locations of the cells including the clock sinks within a block. This in turn helps determine the local sink cluster contents, which tends to be largely area based as shown in FIG. 15.

Netlist aware placement, in which library cells including sinks are physically co-located according to their netlist hierarchy, should be used to insure local sink cluster contents are tightly related in terms of interconnecting logic. This approach supports higher performance implementations because sinks that share common clock tree branches are less impacted by OCV timing effects, which helps minimize timing path routing delays. Also, when highly interconnected clock sinks share the same clock tree branch, potential clock gating implementations become more efficient since the clock gating can be done at a higher level. This requires fewer clock gating cells, which reduces power consumption and design area.

Once the number of local sink clusters has been defined, design automation software can run an autocluster step to determine an initial assignment of sinks to local sink clusters. Designers can then review the contents of their local sink clusters and shift sinks from cluster to cluster to further optimize their local sink cluster contents. For example, a GUI sink cluster editor that displays sink clusters with differing sink colors, so that designers can visualize, review and update their local sink clusters, enabling them to easily shift sinks from cluster to cluster, create new local sink clusters or combine existing clusters. In general local sink clusters contents should largely cover a contiguous area which helps minimize routing overhead, rather than having sinks scatter across the design.

There may also be cases where it would be more optimal to add a few more distant sinks to a particular local sink cluster. One skilled in the art should understand their design's hierarchy and data flow and design tradeoffs needed to provide a suitable local sink clustering implementation. IC design efforts tend to be iterative and feedback from subsequent design steps such as clock and signal routing can be used to further refine local sink cluster assignments.

FIG. 20A shows an example of sink cluster editor showing four local sink clusters within a block, where the sinks are automatically clustered into four groups (typically represented using different colors).

Figure 20B:
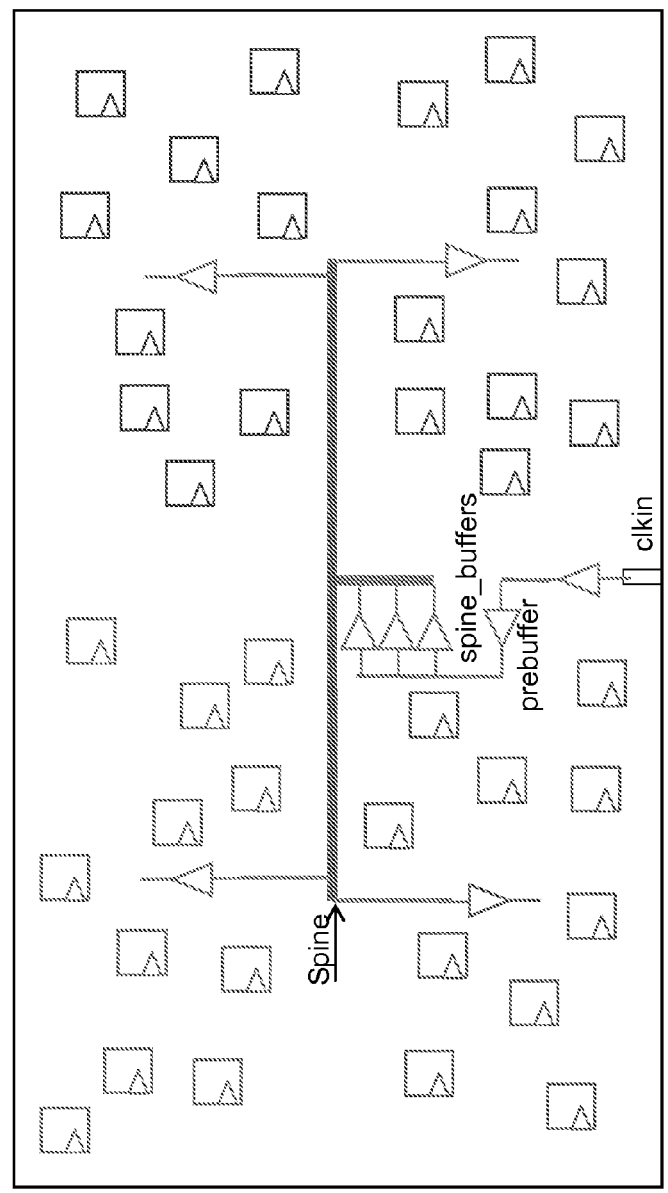

FIG. 20B is similar to FIG. 20A. After local cluster editing, the addition of the spine prebuffers, spine routing, and stitch routing from the spine to root buffers that drive the local sink clusters are shown.

After the clusters are defined, their local clock buffers would be inserted and routed to the local clock sinks Next, these local sink buffers would be stitch routed to the clock spine. Additional stitch routing could to be added to match the routing delays for sink cluster buffers that have differing routing distances from the center of the spine in order to reduce the clock skew. Overall the above block level clock tree should minimize buffer count and routing utilization along with clock insertion delay and clock skew. The above approach is largely correct by construction so it can be reproduced easily and consistently.

An enhancement to this invention that supports more efficient routing of local sink clusters, which is critical for designs with few metal routing layers, involves aligning sinks (registers), where practical, during the cell placement phase. This approach involves minor adjustments to cell locations needed to improve their placement alignment, which in turn supports more efficient routing.

Figure 21A:
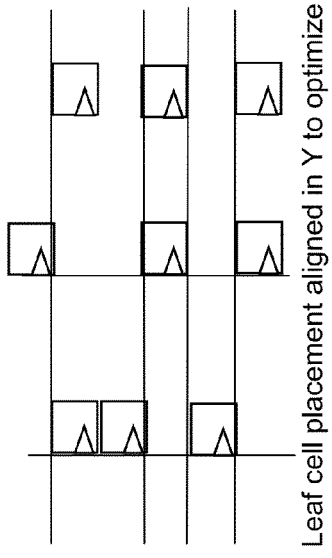
FIGS. 21A-21B show examples of unaligned and aligned sink placement.
Figure 21B:
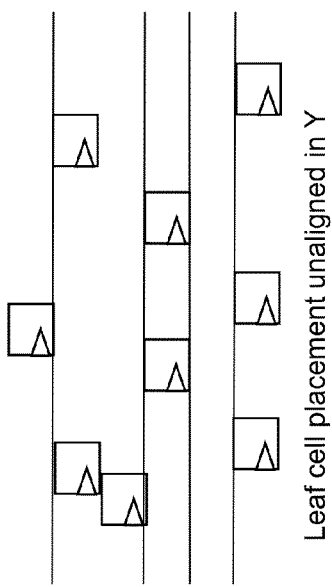

FIG. 21A shows an example of unaligned sink (flip flow) placement. Leaf cell placement is unaligned in Y. FIG. 21B shows sinks (flip flops) that are placed so they are aligned in the Y direction, which results in more efficient routing. Leaf cell placement aligned in Y to optimize clock stitch routing. It follows that one clock route in the Y direction, without jogs in the X direction, would be sufficient to connect to the vertically aligned clock sinks.

Figure 22:
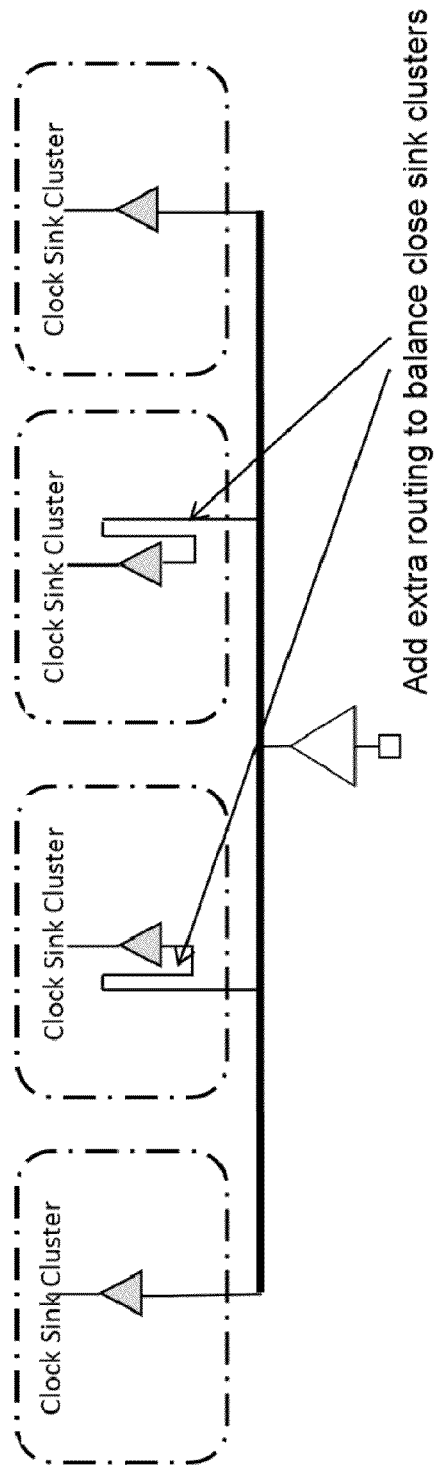
FIG. 22 shows an example of extra routing added to balance delays to close sink clusters.

FIG. 22 shows an example of extra routing added to balance delays to close sink clusters. In various implementations, the clock skew of the spine route may need to be further minimized. This can be achieved by using a larger buffer plus widening the spine route, to reduce the resistance, and hence the RC delay as previously mentioned. Another implementation involves adding routing between the spine and the sink clusters closer to the spine, so their routing delays are a closer match to those of sink clusters that are further from the clock spine.

In a design flow, aspects of the invention can be implemented after the cell placement is completed, but before signal routing. From a top-level perspective, the first step would be to review the top level physical layout and define the number of top-level local clock sink clusters, assuming the top level contains clock sinks (registers). If there is only one top level local sink cluster, all sinks connected to that clock would be assigned to that local sink cluster.

Assuming there is more than one top level local sink clusters, top level sinks should to be assigned to particular local sink clusters. The assignment could be automated by using an autocluster command plus checks and updates afterwards, or the sink cluster assignments could be done by manually.

Cluster buffer tables or similar inputs would then be used to define local sink cluster buffering schemes. As an alternative an automated local sink cluster buffering could also be used. Next the local sink clusters would be buffered and routed. Afterwards, the top level clock routing guide or guides would be interactively added to provide the clock routing topology to the IPs, blocks, and local sink clusters along with top level routing information such as layer, width, spacing optional shielding, and so forth.

Next the clock net buffer guides would be used to select appropriate buffers needed to drive the clock signals. Subsequently the top level clock would be buffered and routed based on the routing and buffering guides.

Clock signal distribution within blocks would then be addressed. The number of local sink clusters would need to be defined for each block. Next the clock sinks would be assigned to local sink clusters in each block, either manually or by using an automated command. If a block contains only one local sink cluster, the local cluster assignment is simplified, all sinks connected to that clock are within a single cluster and a clock spine is not needed. However, for blocks with multiple local sink clusters, the designer could use an autoclustering capability, plus a cluster editor could to review and update the sink cluster contents as needed.

Cluster buffer tables or similar inputs would then be used to provide inputs for local sink cluster buffering, or an automated approach to local sink cluster buffering could be used. Next the local sink clusters should be buffered and routed. Afterwards, the block level clock spine would then be generated, either by hand, or with design automation software.

Finally the block's input pin would be routed to the block level clock spine, which would then be routed to the local sink cluster's root buffer's input pins. These connections could be based on topology and buffering provided by routing guides or by hand or using automated routing capabilities.

After the block level clock trees are completed, their insertion delays can then be determined. The blocks should then be integrated into the top level, and the block level clock insertion delays should be balanced by adding clock buffers to the top level of the design. One skilled in the art should be able to produce reasonable local sink cluster implementations, clock spin implementations, as well as top level clock distribution topologies and buffering schemes that support reasonable clock tree implementations.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A method comprising:
using at least one processor, using top level routing and buffering guides to control the top level clock signal implementation comprising:
identifying N clock pins to couple;
calculating a route area to comprise the positions the N clock pins;
routing a spine interconnect extending in a first direction a length of the route area in the first direction;
coupling the spine interconnect to a prebuffer that is coupled to a clock input pin; and
routing N stitching interconnects in a second direction to couple each of the N pins to the spine interconnect,
wherein each of the N stitching interconnects comprises at least one buffer, and
the first direction is orthogonal to the second direction.

2. The method of claim 1 further comprising:
based on a positioning of a stitch interconnect, adding extra length to a first stitch interconnect routing compared to a second a second stitch interconnect, wherein the first stitch interconnect couples to a first clock sink cluster, and the second stitch interconnect couples to a second clock sink cluster.

3. The method of claim 2 further wherein a positioning of the first stitch interconnect is closer to the prebuffer than a positioning of the second stitch interconnect.

4. The method of claim 1 comprising:
aligning the cells associated with N clock pins in the second direction.

5. The method of claim 1 wherein the coupling the spine interconnect to a prebuffer that is coupled to a clock input pin comprises:
placing a connection between the prebuffer and the spine interconnect at approximately a center of between ends of the spine interconnect.

6. The method of claim 1 wherein the coupling the spine interconnect to a prebuffer that is coupled to a clock input pin comprises:
placing a first connection between the prebuffer and the spine interconnect at approximately a center of between connections to stitch interconnects on either side of the first connection.

7. The method of claim 1 wherein the prebuffer comprises a plurality of buffer circuits coupled in parallel.

8. The method of claim 1 wherein the prebuffer comprises at least a first level buffer, second level buffer, third level buffers comprising X buffers in parallel, fourth level buffers comprising Y buffers, and Y is greater than X.

9. The method of claim 8 wherein Y is at least three times X.

10. The method of claim 1 wherein the spine interconnect has greater width than each of the stitch interconnects.

11. The method of claim 1 comprising:
coupling a stitch interconnect to at least a first parallel buffer and a second parallel buffer, wherein the first and second parallel buffers extend in the first direction and drive in opposite directions to each other.

12. The method of claim 1 comprising:
coupling a stitch interconnect to at least first, second, third, and fourth parallel buffers, wherein the first, second, third, and fourth parallel buffers extend in the first direction, the first and second parallel buffers drive in opposite directions to each other, and the third and fourth parallel buffers drive in opposite directions to each other.

13. A method comprising:
using at least one processor, using netlist-aware placement of clock sinks to drive clock sink placement, which optimizes local sink clustering and buffering comprising:
identifying N and M clock pins to couple;
routing a first spine interconnect extending in a first direction a length of the route area in the first direction;
coupling the first spine interconnect to a prebuffer that is coupled to a clock source;
routing a second spine interconnect extending in a first direction a length of the route area in the first direction;
coupling the first spine interconnect through at least a first buffer to drive the second spine interconnect;
routing N stitching interconnects in a second direction to couple each of the N pins to the first spine interconnect,
wherein each of the N stitching interconnects comprises at least one buffer, and
the first direction is orthogonal to the second direction; and
routing M stitching interconnects in the second direction to couple each of the M pins to the second spine interconnect,
wherein each of the M stitching interconnects comprises at least one buffer.

14. The method of claim 13 comprising:
based on a positioning of a stitch interconnect, adding extra length to a first stitch interconnect routing compared to a second a second stitch interconnect, wherein the first stitch interconnect couples to a first clock sink cluster, and the second stitch interconnect couples to a second clock sink cluster.

15. The method of claim 14 further wherein a positioning of the first stitch interconnect is closer to the prebuffer than a positioning of the second stitch interconnect.

16. The method of claim 13 comprising:
aligning the cells associated with N clock pins in the second direction.

17. The method of claim 13 wherein the first spine interconnect has greater width than each of the stitch interconnects.

18. The method of claim 17 wherein the second spine interconnect has greater width than each of the stitch interconnects.

19. The method of claim 13 comprising:
coupling a first stitch interconnect between the second stitch interconnect and at least a first parallel buffer and a second parallel buffer, wherein the first and second parallel buffers extend in the first direction and drive in opposite directions to each other.

20. The method of claim 13 comprising:
coupling a stitch interconnect between the first stitch interconnect and at least first, second, third, and fourth parallel buffers, wherein the first, second, third, and fourth parallel buffers extend in the first direction, the first and second parallel buffers drive in opposite directions to each other, and the third and fourth parallel buffers drive in opposite directions to each other.

* * * * *